(12) United States Patent
Hirase et al.

(10) Patent No.: US 12,074,177 B2
(45) Date of Patent: *Aug. 27, 2024

(54) IMAGING DEVICE AND CAMERA SYSTEM

(71) Applicant: PANASONIC INTELLECTUAL PROPERTY MANAGEMENT CO., LTD., Osaka (JP)

(72) Inventors: Junji Hirase, Osaka (JP); Masashi Murakami, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/096,296

(22) Filed: Jan. 12, 2023

(65) Prior Publication Data

US 2023/0154944 A1 May 18, 2023

Related U.S. Application Data

(63) Continuation of application No. 17/095,019, filed on Nov. 11, 2020, now abandoned, which is a
(Continued)

(30) Foreign Application Priority Data

Apr. 26, 2017 (JP) ................. 2017-087648

(51) Int. Cl.
*H04N 25/77* (2023.01)
*G02B 7/04* (2021.01)
(Continued)

(52) U.S. Cl.
CPC .......... *H01L 27/14603* (2013.01); *G02B 7/04* (2013.01); *H01L 27/14609* (2013.01);
(Continued)

(58) Field of Classification Search
None
See application file for complete search history.

(56) References Cited

U.S. PATENT DOCUMENTS 10,868,051 B2 * 12/2020 Hirase .................... H04N 25/75
2005/0051707 A1 * 3/2005 Bamji ..................... G01S 7/487
250/214 R
(Continued)

FOREIGN PATENT DOCUMENTS

| CN | 104412387 A | 3/2015 |
| CN | 105742303 A | 7/2016 |

(Continued)

OTHER PUBLICATIONS

Title: Transistor Website: https://web.archive.org/web/20140327005417/ https://en.wikipedia.org/wiki/Transistor Date: Mar. 27, 2014 (Year: 2014).*

(Continued)

*Primary Examiner* — Twyler L Haskins
*Assistant Examiner* — Wesley J Chiu
(74) *Attorney, Agent, or Firm* — Rimon P.C.

(57) ABSTRACT

An imaging device including a pixel including: a photoelectric converter including a first electrode, a second electrode, and a photoelectric conversion film between the first electrode and the second electrode, the photoelectric conversion film converting light into a charge; a first transistor having a first source, drain and gate, the first gate connected to the first electrode; and a second transistor having a second source and drain, one of the second source and the second drain connected to the first electrode and being a charge accumulation region that accumulates the charge. The imaging device further including a first voltage supply circuit supplying a first voltage to the second electrode, where the second transistor has a characteristic that when a voltage of the charge accumulation region is equal to or greater than a
(Continued)

clipping voltage, the second transistor is turned off, and the clipping voltage is lower than the first voltage.

13 Claims, 12 Drawing Sheets

Related U.S. Application Data continuation of application No. 15/961,964, filed on Apr. 25, 2018, now Pat. No. 10,868,051.

(51) Int. Cl.
*H01L 27/146* (2006.01)
*H04N 25/65* (2023.01)
*H04N 25/70* (2023.01)
*H04N 25/75* (2023.01)
*H04N 25/771* (2023.01)
*G02B 13/16* (2006.01)

(52) U.S. Cl.
CPC ....... *H01L 27/14689* (2013.01); *H04N 25/65* (2023.01); *H04N 25/70* (2023.01); *H04N 25/75* (2023.01); *H04N 25/77* (2023.01); *H04N 25/771* (2023.01); *G02B 13/16* (2013.01)

(56) References Cited

U.S. PATENT DOCUMENTS

| | | | | |
|---|---|---|---|---|
| 2005/0151175 | A1* | 7/2005 | Ohkawa | H01L 27/14601 257/292 |
| 2005/0161713 | A1 | 7/2005 | Rhodes | |
| 2007/0069258 | A1 | 3/2007 | Ahn | |
| 2007/0091190 | A1 | 4/2007 | Iwabuchi et al. | |
| 2008/0036888 | A1* | 2/2008 | Sugawa | H04N 25/778 348/294 |
| 2009/0179293 | A1 | 7/2009 | Shim et al. | |
| 2015/0090998 | A1* | 4/2015 | Hirase | H01L 27/14645 257/40 |
| 2015/0109503 | A1* | 4/2015 | Mori | H01L 27/14645 348/300 |
| 2015/0115339 | A1 | 4/2015 | Tamaki et al. | |
| 2015/0256777 | A1* | 9/2015 | Ishii | H04N 25/77 250/208.1 |
| 2015/0340394 | A1* | 11/2015 | Hirase | H01L 27/14636 257/292 |
| 2016/0014364 | A1 | 1/2016 | Tashiro et al. | |
| 2016/0035780 | A1* | 2/2016 | Itahashi | H04N 25/75 257/432 |
| 2016/0037117 | A1 | 2/2016 | Ono et al. | |
| 2016/0049523 | A1 | 2/2016 | Yamada | |
| 2016/0190188 | A1 | 6/2016 | Murakami et al. | |
| 2016/0211293 | A1* | 7/2016 | Wei | H01L 27/14643 |
| 2016/0316163 | A1* | 10/2016 | Beck | H04N 25/59 |
| 2016/0360132 | A1* | 12/2016 | Kanehara | H04N 25/745 |
| 2017/0207257 | A1* | 7/2017 | Nishihara | H01L 27/14616 |
| 2017/0330907 | A1 | 11/2017 | Kwag et al. | |
| 2019/0189696 | A1 | 6/2019 | Yamaguchi et al. | |

FOREIGN PATENT DOCUMENTS

| | | |
|---|---|---|
| JP | 2009-164604 | 7/2009 |
| JP | 2011-228621 | 11/2011 |
| JP | 2017-046333 | 3/2017 |
| WO | 2011/125677 | 10/2011 |
| WO | 2014/002330 A1 | 1/2014 |
| WO | 2014/083730 A1 | 6/2014 |

OTHER PUBLICATIONS

English Translation of Chinese Search Report dated Jan. 13, 2023 for the related Chinese Patent Application No. 201810244783.6.
Non-Final Office Action issued in U.S. Appl. No. 15/961,964, dated Jul. 18, 2019.
Final Office Action issued in U.S. Appl. No. 15/961,964, dated Nov. 6, 2019.
Non-Final Office Action issued in U.S. Appl. No. 15/961,964, dated May 18, 2020.
Notice of Allowance issued in U.S. Appl. No. 15/961,964, dated Sep. 4, 2020.
Non-Final Office Action issued in U.S. Appl. No. 17/095,019, dated Jan. 25, 2022.
Final Office Action issued in U.S. Appl. No. 17/095,019, dated May 3, 2022.
Non-Final Office Action issued in U.S. Appl. No. 17/095,019, dated Oct. 17, 2022.

* cited by examiner

IMAGING DEVICE AND CAMERA SYSTEM

CROSS-REFERENCE OF RELATED APPLICATIONS

This application is a Continuation of U.S. patent application Ser. No. 17/095,019, filed on Nov. 11, 2020, which is a Continuation of U.S. patent application Ser. No. 15/961,964, filed on Apr. 25, 2018, now U.S. Pat. No. 10,868,051, which claims the benefit of Japanese Application No. 2017-087648, filed on Apr. 26, 2017, the entire disclosures of which Applications are incorporated by reference herein.

BACKGROUND

1. Technical Field

The present disclosure relates to an imaging device and, more particularly, to an imaging device that has a photoelectric converter including a photoelectric conversion film laminated on a semiconductor substrate.

2. Description of the Related Art

A laminated imaging device is proposed as an imaging device of the metal oxide semiconductor (MOS) type. In a laminated imaging device, a photoelectric conversion film is laminated on the surface of a semiconductor substrate. Charges generated in the photoelectric conversion film by photoelectric conversion are accumulated in a charge accumulation region, which is referred to as a floating diffusion. The imaging device uses a charge coupled device (CCD) circuit or a complementary MOS (CMOS) circuit formed on the semiconductor substrate to read out the accumulated charges. Japanese Unexamined Patent Application Publication No. 2009-164604, for example, discloses this type of imaging device.

SUMMARY

An imaging device having a higher dynamic range is demanded.

In one general aspect, the techniques disclosed here feature an imaging device comprising: a pixel including a photoelectric converter including a first electrode, a second electrode facing the first electrode, and a photoelectric conversion film between the first electrode and the second electrode, the photoelectric conversion film converting light into a charge, a first transistor having a first source, a first drain and a first gate, the first gate being connected to the first electrode, and a second transistor having a second source and a second drain, one of the second source and the second drain being connected to the first electrode and being a charge accumulation region that accumulates the charge, and a first voltage supply circuit supplying a first voltage to the second electrode, wherein the second transistor has such a characteristic that when a voltage of the charge accumulation region is equal to or greater than a clipping voltage, the second transistor is turned off, and the clipping voltage is lower than the first voltage.

It should be noted that comprehensive or specific aspects may be implemented as an element, a device, a module, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
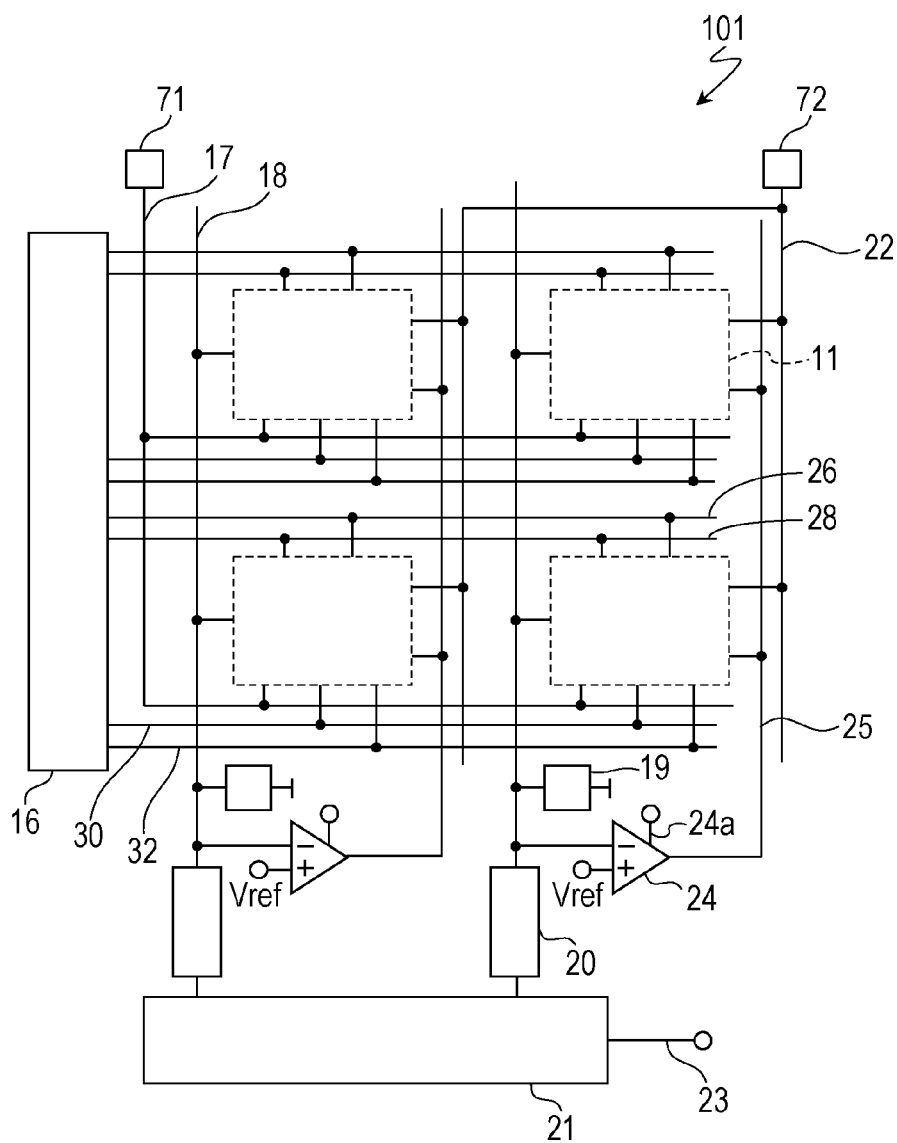
FIG. 1 schematically illustrates an exemplary circuit structure of an imaging device according to a first embodiment.

One aspect of the present disclosure will be outlined below.

Item 1

An imaging device comprising:
  a pixel including
    a photoelectric converter including a pixel electrode, a counter electrode facing the pixel electrode, and a photoelectric conversion film between the counter electrode and the pixel electrode, the photoelectric conversion film converting light into a charge,
    an amplification transistor having a first source, a first drain, and a first gate, the first gate being connected to the pixel electrode,
    a reset transistor having a second source, a second drain, and a second gate, one of the second source and the second drain being connected to the pixel electrode, and a feedback transistor having a third source and a third drain, one of the third source and the third drain being connected to the other of the second source and the second drain; and a first voltage supply circuit supplying a first voltage to the counter electrode, wherein the reset transistor has such a characteristic that when a voltage equal to or higher than a clipping voltage is supplied between the second gate and the one of the second source and the second drain, the reset transistor is turned off, and the clipping voltage is lower than the first voltage.

Item 2

The imaging device according to Item 1, further comprising a second voltage supply circuit that supplies a second voltage to one of the first source and the first drain of the amplification transistor, wherein the clipping voltage is lower than the second voltage.

Item 3

The imaging device according to Item 1, wherein the feedback transistor has a first gate insulting film and a third gate on the first gate insulting film, the reset transistor has a second gate insulting film and the second gate on the second gate insulting film, and an effective thickness of the first gate insulting film is smaller than an effective thickness of the second gate insulting film.

Item 4

The imaging device according to Item 3, wherein the effective thickness of the first gate insulating film is 80% or less of the effective thickness of the second gate insulating film.

Item 5

The imaging device according to Item 4, wherein the effective thickness of the first gate insulating film is 50% or less of the effective thickness of the second gate insulating film.

Item 6

The imaging device according to Item 5, wherein the effective thickness of the first gate insulating film is 30% or less of the effective thickness of the second gate insulating film.

Item 7

The imaging device according to any one of Items 1 to 6, wherein the pixel has a first capacitor connected between the second source and the second drain of the reset transistor, and a second capacitor connected to the other of the second source and the second drain of the reset transistor, the second capacitor has a first electrode, a second electrode facing the first electrode, and a dielectric layer between the first electrode and the second electrode, and an effective thickness of the dielectric layer is smaller than an effective thickness of the second gate insulting film.

Item 8

The imaging device according to Item 7, wherein the effective thickness of the dielectric layer is smaller than an effective thickness of the first gate insulting film.

Item 9

The imaging device according to any one of Items 1 to 8, wherein the pixel includes a first line connected to the other of the second source and the second drain of the reset transistor, a third voltage being applied to the first line, a second line adjacent to the first line, a fourth voltage different from the third voltage being applied to the second line, a third line connecting the pixel electrode and the first gate together, and a fourth line adjacent to the third line, and an interval between the first line and the second line is smaller than an interval between the third line and the fourth line.

Item 10

A camera system comprising:

the imaging device according to any one of Items 1 to 9;

a lens optical system that focuses light onto the imaging device; and a camera signal processor that processes a signal output from the imaging device.

First Embodiment

Findings made by the inventors will be described before embodiments are described in detail.

As for a so-called CCD image sensor or CMOS image sensor in which a photodiode is formed on a semiconductor substrate, it is known that kTC noise can be removed by applying correlated double sampling (CDS) to a 4-transistor read-out circuit. In a typical laminated imaging device, a metal line or metal layer is present between a photoelectric converter and a semiconductor substrate to establish an electrical connection between the photoelectric converter and the semiconductor substrate. This makes it hard to completely transfer charges collected by a pixel electrode in the photoelectric converter to a floating diffusion in the semiconductor substrate. Therefore, when a method in which correlated double sampling is applied is simply used, the method is not effective for a laminated imaging device. A demand made on the laminated imaging device is to reduce kTC noise. Another demand made on the laminated imaging device is to expand the dynamic range.

FIG. 1 schematically illustrates an exemplary circuit structure of an imaging device 101 according to a first embodiment.

The imaging device 101 illustrated in FIG. 1 has a plurality of pixels 11 and a peripheral circuit. The plurality of pixels 11 form a pixel area by being two-dimensionally arranged on a semiconductor substrate.

In the example in FIG. 1, the plurality of pixels 11 are arranged in a row direction and in a column direction. In this specification, the row direction is a direction in which rows extend and the column direction is a direction in which columns extend. That is, in the drawing, the vertical direction on the drawing sheet is the column direction and the horizontal direction on the drawing sheet is the row direction. The plurality of pixels 11 may be one-dimensionally arranged.

Each pixel 11 is connected to a power supply line 22. A voltage supply circuit 72, which is connected to the power supply line 22, supplies a predetermined power supply voltage AVDD to each pixel 11 through the power supply line 22. Each pixel 11 includes a photoelectric converter having a photoelectric conversion film laminated on the semiconductor substrate, as will be described later in detail. The imaging device 101 also has an accumulation control line 17 used to apply the same predetermined voltage to all photoelectric converters, as illustrated in FIG. 1.

The peripheral circuit in the imaging device 101 includes a vertical scanning circuit 16 (also referred to as a row scanning circuit), a load circuit 19, a column signal processing circuit 20 (also referred to as a row signal accumulation circuit), a horizontal signal read-out circuit 21 (also referred to as a column scanning circuit), and an inverting amplifier 24. In the structure in FIG. 1, a combination of the column signal processing circuit 20, load circuit 19, and inverting amplifier 24 is placed for each column of two-dimensionally arranged pixels 11. That is, in this example, the peripheral circuit includes a plurality of column signal processing circuits 20, a plurality of load circuits 19, and a plurality of inverting amplifiers 24.

The vertical scanning circuit 16 is connected to address signal lines 30 and reset signal lines 26. The vertical scanning circuit 16 applies a predetermined voltage to the address signal lines 30 to select a plurality of pixels 11 placed in each row on a per-row basis. Thus, the signal voltage of the selected pixels 11 is read out. In the example in FIG. 1, the vertical scanning circuit 16 is also connected to feedback control lines 28 and sensitivity adjustment lines 32. When the vertical scanning circuit 16 applies a predetermined voltage to a feedback control line 28, a feedback circuit used to negatively feed back an output from the relevant pixels 11 can be formed, as will be described later. The vertical scanning circuit 16 can also apply a predetermined voltage to a plurality of pixels 11 through the relevant sensitivity adjustment line 32. In the present disclosure, each pixel 11 internally has at least one capacitor, as will be described later in detail. In this specification, the capacitor has a structure in which a dielectric body is sandwiched between electrodes. The electrode in this specification is not limited to an electrode formed from a metal but is interpreted as widely including a polysilicon layer and the like. The electrode in this specification may be part of a semiconductor substrate.

The pixels 11 placed in each column are electrically connected to the column signal processing circuit 20 corresponding to the column through a vertical signal line 18 corresponding to the column. The load circuit 19 is electrically connected to the vertical signal line 18. The column signal processing circuit 20 performs noise suppression signal processing typified by correlated double sampling, analog-digital conversion (AD conversion), and other processing. The horizontal signal read-out circuit 21 is electrically connected to a plurality of column signal processing circuits 20, each of which is provided in correspondence to one row of pixels 11. The horizontal signal read-out circuit 21 successively reads out signals from the plurality of column signal processing circuits 20 and outputs the read-out signals to a horizontal common signal line 23.

In the structure illustrated in FIG. 1, each of the plurality of inverting amplifiers 24 is provided in correspondence to one column. The negative input terminal of the inverting amplifier 24 is connected to its corresponding vertical signal line 18. A predetermined voltage is supplied to the positive input terminal of the inverting amplifier 24. The predetermined voltage is, for example, 1 V or a positive voltage near 1V. The output terminal of the inverting amplifier 24 is connected through one of feedback lines 25, each of which is provided in correspondence to one column, to a plurality of pixels 11 having a connection to the negative input terminal of the inverting amplifier 24. The inverting amplifier 24 forms part of a feedback circuit used to negatively feed back an output from the pixels 11. The inverting amplifier 24 may be referred to as the feedback amplifier. The inverting amplifier 24 includes a gain adjustment terminal 24a used to change an inverting amplifier gain. The operation of the inverting amplifier 24 will be described later.

Figure 2:
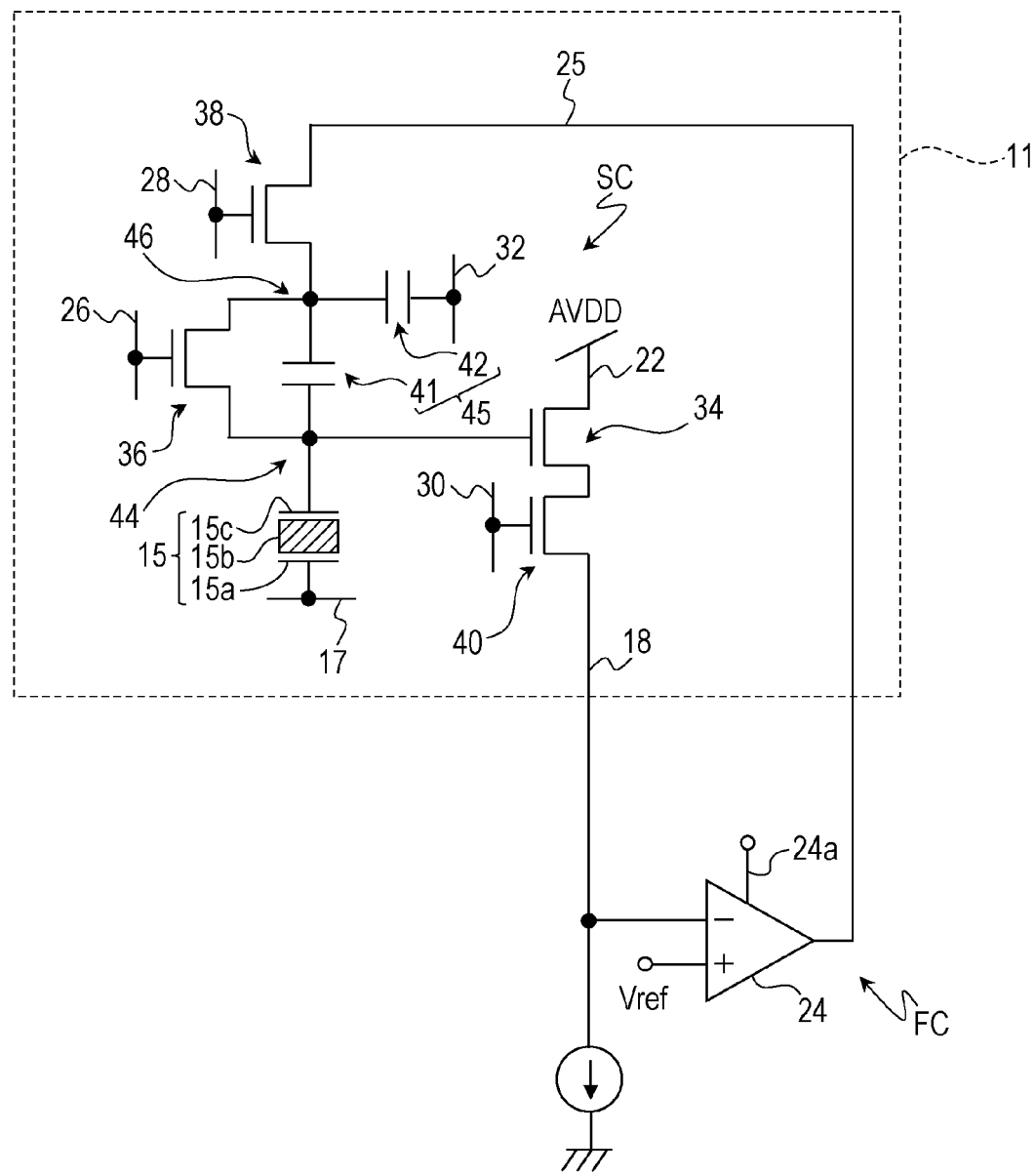
FIG. 2 schematically illustrates of an exemplary circuit structure of a pixel according to the first embodiment.

FIG. 2 schematically illustrates of an exemplary circuit structure of the pixel 11 in FIG. 1. The pixel 11 includes a photoelectric converter 15 and a signal detection circuit SC.

Typically, the photoelectric converter 15 has a structure in which a photoelectric conversion film 15b is sandwiched between an counter electrode 15a and a pixel electrode 15c. The photoelectric conversion film 15b is laminated on the semiconductor substrate on which pixels 11 are formed, as will be described later with reference to a drawing. The photoelectric conversion film 15b is formed from an organic material or an inorganic material such as amorphous silicon. The photoelectric conversion film 15b may include a layer formed from an organic material and a layer formed from an inorganic material.

The counter electrode 15a is disposed on the light receiving surface of the photoelectric conversion film 15b. The counter electrode 15a is formed from a transparent conductive material such as indium tin oxide (ITO). The pixel electrode 15c is provided so as to face the counter electrode 15a through the photoelectric conversion film 15b. The pixel electrode 15c collects charges generated in the photoelectric conversion film 15b due to photoelectric conversion. The pixel electrode 15c is formed from a metal such as aluminum or copper, a metal nitride, polysilicon doped with an impurity to have conductivity, or another material.

As illustrated in FIG. 2, the counter electrode 15a is connected to the accumulation control line 17 and the pixel electrode 15c is connected to a charge accumulation region 44. The charge accumulation region 44 is also referred to as floating diffusion node 44. A voltage supply circuit 71 is connected to the accumulation control line 17. The voltage supply circuit 71 controls the potential of the counter electrode 15a through the accumulation control line 17. Therefore, any one of a hole or an electron of a hole-electron pair generated due to photoelectric conversion can be collected by the pixel electrode 15c. To use a hole as a signal charge, it is only needed that the potential of the counter electrode 15a is higher than the potential of the pixel electrode 15c. A case in which a hole is used as a signal charge will be described below as an example. A voltage of about 10 V, for example, is applied to the counter electrode 15a through the accumulation control line 17. Thus, a signal charge is accumulated in the charge accumulation region 44. Of course, an electron may be used as a signal charge.

The signal detection circuit SC included in the pixel 11 has an amplification transistor 34 and a reset transistor 36. The pixel 11 also includes a capacity circuit 45 in which a first capacitor 41 and a second capacitor 42 are connected in series. The first capacitor 41 and second capacitor 42 each have a structure in which a dielectric layer is sandwiched between electrodes. In the structure illustrated in FIG. 2, the second capacitor 42 has a larger capacitance than the first capacitor 41. In the structure in FIG. 2, one of the source and drain of the reset transistor 36 and one of the electrodes of the first capacitor 41 are connected to the charge accumulation region 44. That is, the source or drain of the reset transistor 36 and one electrode of the first capacitor 41 each have an electrical connection to the pixel electrode 15c.

The other of the source and drain of the reset transistor 36 and the other electrode of the first capacitor 41 are connected to one of the electrodes of the second capacitor 42. That is, in this example, the first capacitor 41 is connected in parallel to the reset transistor 36. When the first capacitor 41 and reset transistor 36 are connected in parallel, transistor junction leakage to the charge accumulation region 44 can be reduced. Therefore, dark current can be reduced. In the description below, a node including a connection point between the first capacitor 41 and the second capacitor 42 will sometimes be referred to as a reset drain node 46.

Of the electrodes of the second capacitor 42, an electrode that is not connected to the reset drain node 46 is connected to the sensitivity adjustment line 32. The potential of the sensitivity adjustment line 32 is set to a reference potential. The reference potential is, for example, 0 V. When the imaging device 101 operates, the potential of the sensitivity adjustment line 32 does not need to remain unchanged. For example, a pulse voltage may be supplied from the vertical scanning circuit 16. The sensitivity adjustment line 32 can be used to control the potential of the charge accumulation region 44, as will be described later.

Of course, when the imaging device 101 operates, the potential of the sensitivity adjustment line 32 may remain unchanged. As illustrated in FIG. 2, the gate of the amplification transistor 34 is connected to the charge accumulation region 44. In other words, the gate of the amplification transistor 34 has an electrical connection to the pixel electrode 15c. One of the source and drain of the amplification transistor 34 (drain if the amplification transistor 34 is an N-channel MOS transistor) is connected to the power supply line 22 (source follower power supply), and the other is connected to the vertical signal line 18. That is, the power supply voltage AVDD is supplied to one of the source and drain of the amplification transistor 34. A source follower circuit is formed from the amplification transistor 34 and load circuit 19 (see FIG. 1), which is not illustrated in FIG. 2. The amplification transistor 34 amplifies a signal generated by the photoelectric converter 15.

As illustrated in FIG. 2, the pixel 11 includes an address transistor 40. The source or drain of the address transistor 40 is connected to one of the source and drain of the amplification transistor 34, which is not connected to the power supply line 22. The gate of the address transistor 40 is connected to the address signal line 30. In the structure illustrated in FIG. 2, the address transistor 40 forms part of the signal detection circuit SC.

A voltage is applied to the gate of the amplification transistor 34 according to the amount of charge accumulated in the charge accumulation region 44. The amplification transistor 34 amplifies this voltage. The voltage amplified by the amplification transistor 34 is selectively read out as a signal voltage by the address transistor 40.

In the structure illustrated in FIG. 2, the pixel 11 further includes a feedback transistor 38. One of the source and drain of the feedback transistor 38 is connected to the reset drain node 46, and the other is connected to the feedback line 25. That is, in the illustrated structure, the reset drain node 46 is connected to the feedback line 25 through the feedback transistor 38. The gate of the feedback transistor 38 is connected to the feedback control line 28. When the voltage of the feedback control line 28 is controlled, a feedback circuit FC that feeds back (in this example, negatively feeds back) an output of the signal detection circuit SC can be formed, as will be described later in detail.

The amplification transistor 34, reset transistor 36, address transistor 40, and feedback transistor 38 may be each an N-channel MOS transistor or a P-channel MOS transistor. In addition, they do not need to be of the same type, N-channel MOS or P-channel MOS. In the description below, a case in which the amplification transistor 34, reset transistor 36, address transistor 40, and feedback transistor 38 are each an N-channel MOS transistor will be taken as an example. Besides a field effect transistor (FET), a bipolar transistor may be used as a transistor.

Device Structure of the Pixel

Next, an example of the device structure of the pixel 11 will be described with reference to FIG. 3. As already described above, the pixels 11 are placed on a semiconductor substrate. Now, an example will be described in which a P-type silicon (Si) substrate is used as a semiconductor substrate 2 (see FIG. 3).

Figure 3:
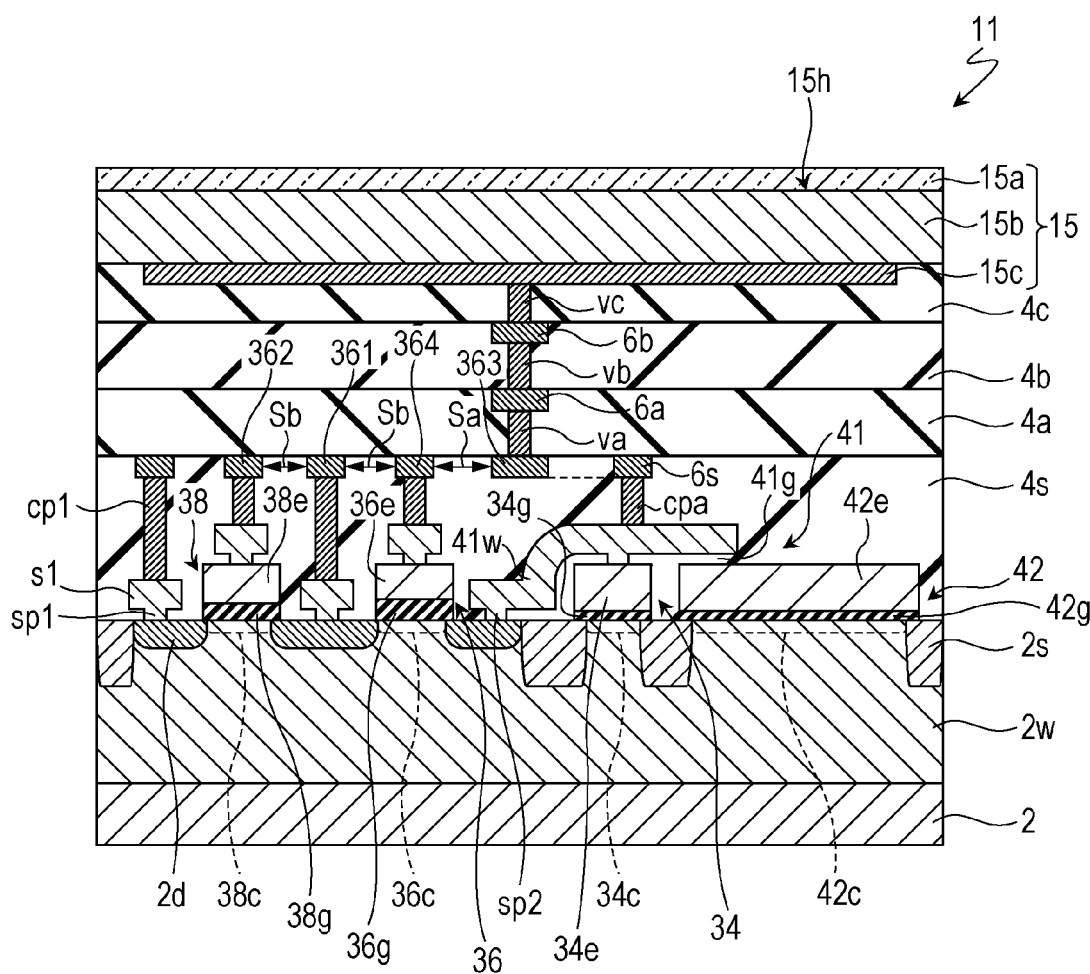
FIG. 3 is a cross-sectional view schematically illustrating the device structure of the pixel according to the first embodiment.

As illustrated in FIG. 3, the pixel 11 has the photoelectric converter 15 on the semiconductor substrate 2. In the example in the drawing, inter-layer insulating layers 4s, 4a, 4b, and 4c are laminated on the semiconductor substrate 2, and the photoelectric conversion film 15b of the photoelectric converter 15 is laminated on the inter-layer insulating layers 4s, 4a, 4b, and 4c. The counter electrode 15a is disposed on the light receiving surface 15h of the photoelectric conversion film 15b, light from a subject being incident on the light receiving surface 15h. The pixel electrode 15c is disposed on the surface opposite to the light receiving surface 15h.

The pixel electrode 15c is electrically separated among a plurality of pixels 11. In the structure illustrated in FIG. 3, the semiconductor substrate 2 has a well 2w with a relatively high acceptor concentration and source/drain diffusion layers 2d. The well 2w is a P-type impurity region and each source/drain diffusion layer 2d is an N-type impurity region.

As illustrated in FIG. 3, the feedback transistor 38 includes two source/drain diffusion layers 2d, a first gate insulating film 38g formed on the semiconductor substrate 2, and a first gate electrode 38e formed on the first gate insulating film 38g. A channel region 38c is formed between the two source/drain diffusion layers 2d, each of which is used as a source or drain.

Similarly, the reset transistor 36 includes two source/drain diffusion layers 2, a second gate insulating film 36g formed on the semiconductor substrate 2, and a second gate electrode 36e formed on the second gate insulating film 36g. A channel region 36c is formed between the two source/drain diffusion layers 2d, each of which used as a source or drain.

In the example in FIG. 3, the reset transistor 36 and feedback transistor 38 share one of the source/drain diffusion layers 2d. The amplification transistor 34 similarly includes two source/drain diffusion layers 2d, a third gate insulating film 34g formed on the semiconductor substrate 2, and a third gate electrode 34e formed on the third gate insulating film 34g.

In FIG. 3, the two source/drain diffusion layers 2d for the amplification transistor 34 are not illustrated, and only the third gate insulating film 34g, the third gate electrode 34e, and a channel region 34c formed between two source/drain diffusion layers 2d are illustrated. The address transistor 40 has almost the same structure as the amplification transistor 34.

The semiconductor substrate 2 has element isolation regions 2s to electrically separate elements. In this example, a combination of the reset transistor 36 and feedback transistor 38 and a combination of the amplification transistor 34 and address transistor 40 are separated by element isolation regions 2s. The semiconductor substrate 2 has an electrode region 42c. The electrode region 42c is electrically separated from the four transistors (amplification transistor 34, reset transistor 36, feedback transistor 38, and address transistor 40) in the pixel 11 by being enclosed by element isolation regions 2s.

In the structure illustrated in FIG. 3, the second capacitor 42 includes a dielectric layer 42g provided on the electrode region 42c and a first electrode 42e facing part of the semiconductor substrate 2 through the dielectric layer 42g.

The dielectric layer 42g is formed from a dielectric body. The second capacitor 42 is electrically connected to one of source and drain of the reset transistor 36, which is not connected to the charge accumulation region 44. In the embodiment described here, the second capacitor 42 is a so-called metal-insulator-semiconductor (MIS) capacitor, but may be a metal-insulator-metal (MIM) capacitor, which will be described later. The first electrode 42e of the second capacitor 42 may be an electrode formed from polysilicon instead of being an electrode formed from a metal. The electrode region 42c, which faces the first electrode 42e as part of the semiconductor substrate 2, functions as a second electrode of the second capacitor 42. The electrode region 42c is electrically connected to the sensitivity adjustment line 32 (see FIG. 2). A predetermined voltage is applied to the electrode region 42c from a voltage supply (in this example, vertical scanning circuit 16) through the sensitivity adjustment line 32. When the potential of the electrode region 42c is controlled, the potential of the charge accumulation region 44 can be controlled. In other words, when a voltage supplied to the electrode region 42c through the sensitivity adjustment line 32 is adjusted, the sensitivity of the imaging device 101 can be adjusted.

The shape and planar dimensions of the dielectric layer 42g do not need to match the shape and planar dimensions of the electrode region 42c when viewed from the direction of the normal of the semiconductor substrate 2. The dielectric layer 42g does not need to cover the whole of the electrode region 42c. The dielectric layer 42g may also be formed on the element isolation region 2s that encloses the electrode region 42c. The electrode region 42c may be formed as an region having a higher impurity concentration than the well 2w by, for example, ion implantation. Alternatively, the electrode region 42c may be formed as an region that is of a different conductive type than the well 2w.

Although, in FIG. 3, the dielectric layer 42g is illustrated so that it has the same thickness as the second gate insulating film 36g of the reset transistor 36 and the first gate insulating film 38g of the feedback transistor 38, their thicknesses do not necessarily have to be set like this. In this embodiment, the dielectric layer 42g has a smaller effective thickness than the second gate insulating film 36g of the reset transistor 36 and the first gate insulating film 38g of the feedback transistor 38.

As illustrated in FIG. 3, an upper electrode 41w electrically connects the source or drain (source/drain diffusion layer 2d) of the reset transistor 36 and the third gate electrode 34e of the amplification transistor 34 together. In this specification, the terms "upper" and "bottom" are used to indicate a relative placement between members and do not intend restrict the orientation of the imaging device 101 in the present disclosure. In the structure illustrated in FIG. 3, the upper electrode 41w is electrically connected to the pixel electrode 15c through a contact plug cpa, a wiring layer 6s, a via va, a wiring layer 6a, a via vb, a wiring layer 6b, and a via vc. Typically, the contact plug cpa, wiring layers 6s, 6a and 6b, and vias va to vc are formed from a metal such as copper. A polysilicon plug sp2, the upper electrode 41w, the contact plug cpa, the wiring layers 6s, 6a and 6b, the vias va to vc, and one of the source and drain of the reset transistor 36 (in this example, drain) function as a charge accumulation region.

As illustrated in FIG. 3, the upper electrode 41w extends to above the first electrode 42e of the second capacitor 42. The upper electrode 41w, the first electrode 42e, and an insulating film 41g sandwiched between them form the first capacitor 41. In other words, the first capacitor 41 includes the first electrode 42e of the second capacitor 42, the insulating film 41g formed on the first electrode 42e, the upper electrode 41w connected to the pixel electrode 15c of the photoelectric converter 15. At least part of the upper electrode 41w of the first capacitor 41 overlaps the first electrode 42e with the insulating film 41g intervening therebetween when viewed from the direction of the normal of the semiconductor substrate 2. In this example, the first capacitor 41 and second capacitor 42 share one of two electrodes that form a capacitor. The insulating film 41g may be part of the inter-layer insulating layers 4s.

As described above, the insulating film 41g may be part of an inter-layer insulating layer formed on the semiconductor substrate 2 or may be a different insulating film (or insulating layer) different from an inter-layer insulating layer. In this example, the upper electrode 41w of the first capacitor 41 is formed from polysilicon as in the case of the first electrode 42e of the second capacitor 42. The capacitance-voltage (CV) curve of a capacitor having a structure in which a dielectric body is sandwiched between two electrodes formed from polysilicon has a flat portion in a relative wide voltage range. As the voltage of the charge accumulation region 44 changes according to the amount of light, the voltage between the electrodes of the first capacitor 41 indicate relatively large changes. Forming the two electrodes of the first capacitor 41 from polysilicon is advantageous in that an increase in the capacitor size can be suppressed and a highly precise capacitor having a flat CV property can be implemented. Another advantage is that an increase in the number of processes in the manufacturing of the imaging device 101 can be suppressed as described later.

Overview of the Operation of the Imaging Device 101

Next, an example of the operation of the imaging device 101 will be described with reference to the drawings. In the structure illustrated in FIG. 2, when the gate voltages of the reset transistor 36 and feedback transistor 38 are appropriately controlled, a switchover can be made between two operation modes in which sensitivity differs, as described below. The two operation modes described here are a first mode in which imaging is possible with relatively high sensitivity and a second mode in which imaging is possible with relatively low sensitivity.

First, the operation of the imaging device 101 in the first mode will be outlined. The first mode is suitable for imaging under low illumination. Under low illumination, high sensitivity is advantageous. If sensitivity is high, however, noise may be amplified. In this embodiment, it is possible to achieve relatively high sensitivity and reduce or eliminate the influence of kTC noise.

Figure 4:
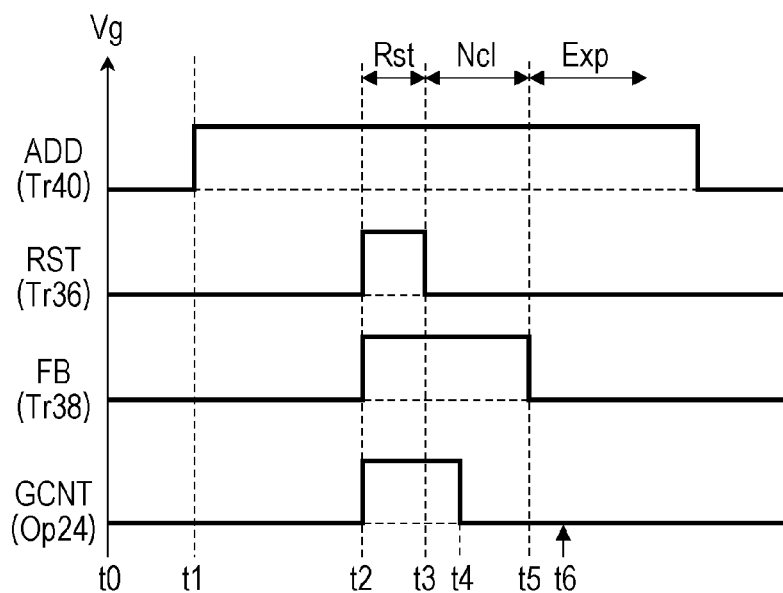
FIG. 4 is a timing diagram illustrating an example of the operations of transistors in a first mode according to the first embodiment.

FIG. 4 is a timing diagram illustrating an example of the operations of transistors in the first mode. In FIG. 4, ADD, RST, FB, and GCNT schematically illustrate an example of changes in the gate voltage of the address transistor 40, the gate voltage of the reset transistor 36, the gate voltage of the feedback transistor 38, and a voltage applied to the gain adjustment terminal 24a of the inverting amplifier 24, respectively. In the example in FIG. 4, the address transistor 40, reset transistor 36, and feedback transistor 38 are all turned off at time to. The gain adjustment terminal 24a of the inverting amplifier 24 is at a voltage of a predetermined value. For simplicity, explanation of the operation of an electronic shutter will be omitted.

First, the potential of the address signal line 30 is controlled to turn on the address transistor 40 (time t1). At that time, signal charges accumulated in the charge accumulation region 44 are read out.

Next, the potentials of the reset signal line 26 and feedback control line 28 are controlled to turn on the reset transistor 36 and feedback transistor 38 (time t2). Then, the charge accumulation region 44 and feedback line 25 are connected together through the reset transistor 36 and feedback transistor 38, forming the feedback circuit FC, which negatively feeds back an output of the signal detection circuit SC. With the feedback transistor 38 intervening between the reset drain node 46 and the feedback line 25, the feedback circuit FC can be selectively formed depending on the state of the reset transistor 36, enabling a signal from the photoelectric converter 15 to be fed back.

In this example, the feedback circuit FC is formed for one of a plurality of pixels 11 that share the feedback line 25. The gate voltage of the address transistor 40 is controlled to select a pixel 11 for which the feedback circuit FC is to be formed. At least one of resetting and noise cancellation, which will be described later, can be executed for the selected pixel 11. In this example, the feedback circuit FC is a negative feedback amplification circuit including the amplification transistor 34, inverting amplifier 24, and feedback transistor 38. The address transistor 40, which was turned on at time t1, supplies an output from the amplification transistor 34 to the feedback circuit FC as an input.

When the charge accumulation region 44 and feedback line 25 are electrically connected together, the charge accumulation region 44 is reset. At that time, since an output from the signal detection circuit SC is negatively fed back, so the voltage of the vertical signal line 18 converges to a target voltage Vref that has been applied to the positive input terminal of the inverting amplifier 24. That is, in this example, the reference voltage in resetting is the target voltage Vref. In the structure illustrated in FIG. 2, the target voltage Vref can be set to a desired voltage between the power supply voltage and ground (0 V). In other words, any voltage within a certain range can be set as the reference signal in resetting. The power supply voltage is, for example, 3.3 V. Any voltage is, for example, a voltage other than the power supply voltage.

At time t2, the potential at the gain adjustment terminal 24a of the inverting amplifier 24 is controlled to lower the gain of the inverting amplifier 24. Since, in the inverting amplifier 24, the product of a gain G and a band B (G×B) is constant, when the gain G is lowered, the band B is widened. When the band B is widened, this means that a cutoff frequency becomes high. Therefore, it becomes possible to speed up convergence described above in the negative feedback amplification circuit.

Next, the reset transistor 36 is turned off (time t3). In the description below, a period from when the reset transistor 36 and feedback transistor 38 are turned on at time t2 until the reset transistor 36 is turned off (a period from time t2 to time t3 in FIG. 4) will sometimes be referred to as the reset period. In FIG. 4, the reset period is schematically indicated by the arrow Rst. When the reset transistor 36 is turned off at time t3, kTC noise is generated. After the reset, therefore, kTC noise is added to the voltage in the charge accumulation region 44.

As seen from FIG. 2, while the feedback transistor 38 remains turned on, the feedback circuit FC remains formed. Therefore, assuming that the gain of the feedback circuit FC is A, kTC noise generated as a result of turning off the reset transistor 36 at time t3 is cancelled to a value of 1/(1+A). In this example, the voltage of the vertical signal line 18 immediately before the reset transistor 36 is turned off (immediately before cancellation of noise starts) is almost equal to the target voltage Vref that has been applied to the negative input terminal of the inverting amplifier 24. When the voltage of the vertical signal line 18 at the time of starting noise cancellation is brought, in advance, close to the target voltage Vref after noise cancellation as described above, kTC noise can be cancelled in a relatively short time. In the description below, a period from when the reset transistor 36 is turned off until the feedback transistor 38 is turned off (a period from time t3 to time t5 in FIG. 4) will sometimes be referred to as the noise cancellation period.

In FIG. 4, the noise cancellation period is schematically indicated by the arrow Ncl. At time t3, the gain of the inverting amplifier 24 remains lowered. Therefore, noise can be cancelled at high speed at the initial time of the noise cancellation period. Next, at time t4, the potential of the gain adjustment terminal 24a of the inverting amplifier 24 is controlled to raise the gain of the inverting amplifier 24. This further lowers the noise level. At that time, the product of the gain G and band B (G×B) is constant, when the gain G is raised, the band B is narrowed. When the band B is narrowed, this means that the cutoff frequency becomes low. That is, convergence in the negative feedback amplification circuit takes time. However, since, a period from time t3 to time t4, the voltage of the vertical signal line 18 has already been controlled so as to be close to the convergence level, a range by which the voltage has to converge is narrow. Therefore, it is possible to inhibit the convergence time from being prolonging due to the narrowed band.

As described above, in this embodiment, it is possible to reduce kTC noise generated as a result of turning off the reset transistor 36 and to cancel the generated kTC noise in a relatively short time.

Next, the feedback transistor 38 is turned off (time t5), after which exposure is executed for a predetermined period. When the feedback transistor 38 is turned off at time t5, kTC noise is generated. The magnitude of kTC noise added to the voltage of the charge accumulation region 44 at that time is $(Cfd/C2)^{1/2} \times (C1/(C1+Cfd))$ times the magnitude when the feedback transistor 38 is connected directly to the charge accumulation region 44 without the first capacitor 41 and second capacitor 42 being provided in the pixel 11. In the above equation, Cfd, C1, and C2 respectively represent the capacitances of the charge accumulation region 44, first capacitor 41, and second capacitor 42, and the symbol× is a multiplication sign. As seen from the equation, the larger the capacitance C2 of the second capacitor 42 is, the smaller generated noise itself is, and the smaller the capacitance of C1 of the first capacitor 41 is, the larger the attenuation ratio is. Therefore, in this embodiment, by appropriately setting the capacitance C1 of the first capacitor 41 and the capacitance C2 of the second capacitor 42, it is possible to adequately reduce kTC noise generated as a result of turning off the feedback transistor 38.

In FIG. 4, the exposure period is schematically indicated by the arrow Exp. At a predetermined timing in the exposure period, kTC noise is cancelled and the reset voltage is read out (time t6). Only a short time is required to read out the reset signal, so the reset voltage may be read out while the address transistor 40 remains turned on. A signal from which fixed noise has been removed is obtained by taking a difference between a signal read out during a period between time t1 and time t2 and a signal read out at time t6. Thus, a signal from which kTC noise and fixed noise have been removed is obtained.

With the reset transistor 36 and feedback transistor 38 turned off, the second capacitor 42 is connected to the charge accumulation region 44 through the first capacitor 41. Now, a case will be assumed in which the charge accumulation region 44 and second capacitor 42 are connected together directly without the first capacitor 41 being interposed. With the second capacitor 42 connected directly to the charge accumulation region 44, the capacitance of an entire region to accumulate signal charges is (Cfd+C2). That is, if the capacitance C2 of the second capacitor 42 is relatively large, the capacitance in the entire region to accumulate signal charges also takes a large value, in which case a high conversion gain (it may also be referred to as a high SN ratio) cannot be obtained. In this embodiment, therefore, the second capacitor 42 is connected to the charge accumulation region 44 through the first capacitor 41. In this structure, the capacitance in the entire region to accumulate signal charges is represented by (Cfd+C1C2/(C1+C2)). If the capacitance C1 of the first capacitor 41 is relatively small and the capacitance C2 of the second capacitor 42 is relatively large, the capacitance in the entire region to accumulate signal charges is approximately (Cfd+C1). That is, an increase in the capacitance in the entire region to accumulate signal charges is small.

When the second capacitor 42 is connected to the charge accumulation region 44 through the first capacitor 41 having a relatively small capacitance, it is possible to inhibit the conversion gain from lowering.

Figure 5:
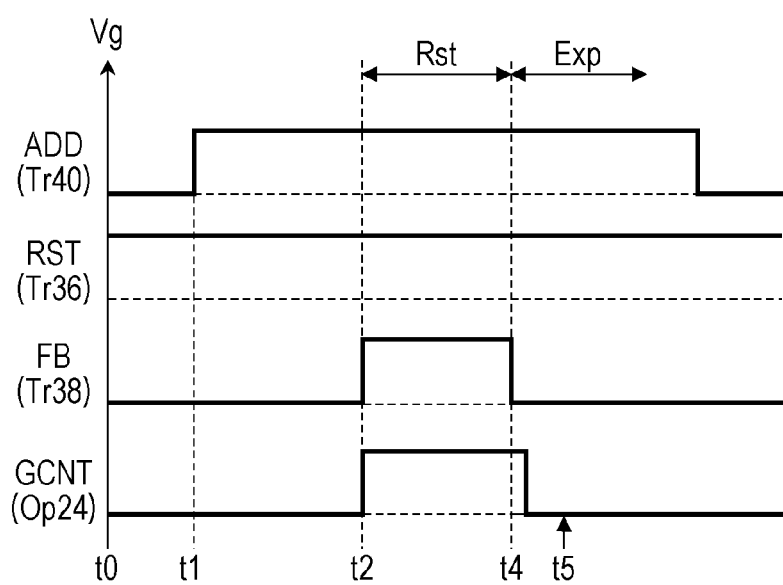
FIG. 5 is a timing diagram illustrating an example of the operations of transistors in a second mode according to the first embodiment.

Next, the operation of the imaging device 101 in the second mode will be outlined with reference to FIG. 5; in the second mode, imaging is possible with relatively low sensitivity. The second mode is suitable for imaging under high illumination. Under high illumination, low sensitivity is advantageous. At relatively low sensitivity, the influence of noise is small but the entire accumulation region to accumulate signal charges is required to have a large capacitance.

FIG. 5 is a timing diagram illustrating an example of the operations of transistors in the second mode. In the first mode described with reference to FIG. 4, the reset transistor 36 has been used to reset the charge accumulation region 44. By contrast, in the second mode, the feedback transistor 38 is used to rest the charge accumulation region 44 while the reset transistor 36 remains turned on. That is, in the second mode, the feedback transistor 38 functions as a reset transistor. In the second mode, the reset transistor 36 remains turned on as illustrated in FIG. 5. At time t1, the address transistor 40 is turned on as in the first mode. At that time, signal charges accumulated in the charge accumulation region 44 are read out. A voltage applied to the gain adjustment terminal 24a of the inverting amplifier 24 has a predetermined value.

Next, the feedback transistor 38 is turned on (time t2). This forms the feedback circuit FC, which negatively feeds back an output from the signal detection circuit SC, resetting the charge accumulation region 44. At that time, the reference voltage in resetting is the target voltage Vref that has been applied to the positive input terminal of the inverting amplifier 24. At time t2, the potential of the gain adjustment terminal 24a of the inverting amplifier 24 is controlled to lower the gain of the inverting amplifier 24. Since, in the inverting amplifier 24, the product of the gain G and band B (G×B) is constant, when the gain G is lowered, the band B is widened. When the band B is widened, this means that a cutoff frequency becomes high. Therefore, it becomes possible to speed up convergence described above in the negative feedback amplification circuit.

Next, the feedback transistor 38 is turned off (time t4). When the feedback transistor 38 is turned off, kTC noise is generated. In this example, at time t4, the gain of the inverting amplifier 24 remains lowered. Therefore, convergence in the negative feedback amplification circuit can be performed at high speed. At time t2, the gain of the inverting amplifier 24 may have been raised by controlling the potential of the gain adjustment terminal 24a of the inverting amplifier 24. In this case, although convergence in the negative feedback amplification circuit takes time, the band B can be narrowed. When the band B is narrowed, this means that the cutoff frequency becomes low. The potential of the gain adjustment terminal 24a (the potential may also be referred to as the gain of the inverting amplifier 24) only needs to have been appropriately set in consideration of a time allowed to reduce noise. After that, exposure is executed for a predetermined period. At a predetermined timing in the exposure period, the reset voltage is read out (time t5).

In the second mode, a noise cancellation period is not preset. In the second mode, which is used in imaging under high illumination, however, shot noise is dominant and the influence of kTC noise is small. A signal from which fixed noise has been removed is obtained by taking a difference between a signal read out during a period between time t1 and time t2 and a signal read out at time t5.

As seen from the above description, in the structure illustrated in FIG. 2, the reset transistor 36 functions as both a reset transistor that resets the charge accumulation region 44 and a switch that makes a switchover between the first mode and the second mode. With this structure, a pixel can be made fine relatively easily.

In this example, when the second capacitor 42 is connected to the charge accumulation region 44, a switchover can be made between a connection that passes through the reset transistor 36 and a connection that passes through the first capacitor 41 by selectively turning on or off the reset transistor 36. That is, an amount by which the potential of the pixel electrode 15c changes can be switched by turning on or off the reset transistor 36. In other words, the sensitivity of the imaging device 101 can be switched by turning on or off the reset transistor 36. Thus, in the structure illustrated in FIG. 2, the reset transistor 36 can be used as a gain switching transistor.

The second capacitor 42 has both a function to reduce kTC noise in the first mode and a function to increase the capacitance of the entire accumulation region to accumulate signal charges. In this embodiment, it is possible to suppress an increase in the number of elements in a pixel and to expand the dynamic range with a simple structure. This is advantageous particularly in making a pixel fine.

Figure 6:
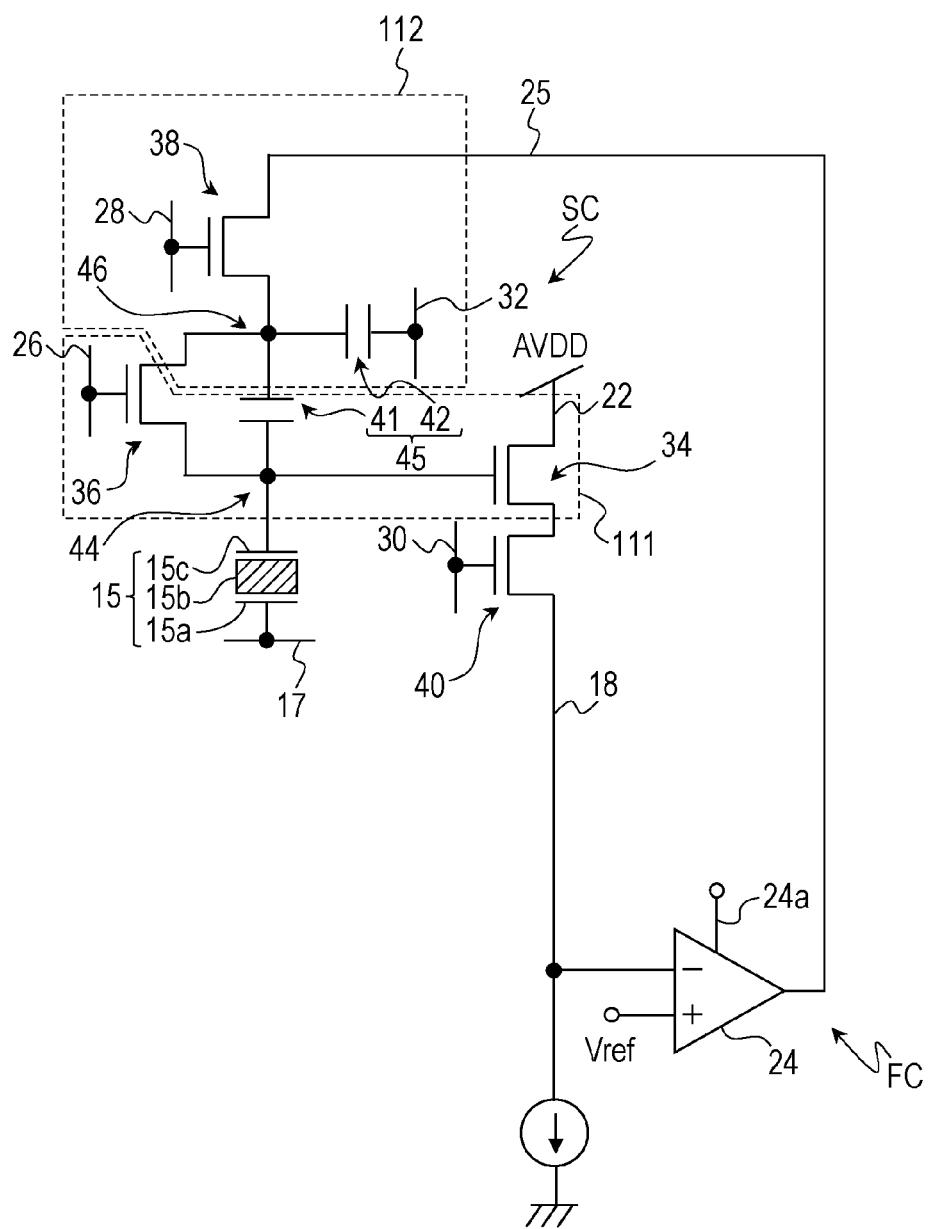
FIG. 6 schematically illustrates areas, according to the first embodiment, on a circuit; in one of which a voltage becomes relatively high and in another of which a voltage does not become high.

Next, findings made by the inventors in the second mode will be described with reference to FIGS. 6 and 7.

When the second mode is selected, that is, high-intensity light like sunlight enters the photoelectric converter 15 with the reset transistor 36 turned on, many carriers are generated in the photoelectric conversion film 15b. Therefore, at the pixel electrode 15c and in the charge accumulation region 44 connected to the pixel electrode 15c and lines directly connected to the charge accumulation region 44 (that is, within a first area 111 in FIG. 6), the voltage may be raised to the voltage of the accumulation control line 17 from which a voltage is applied to the counter electrode 15a. Particularly, when the photoelectric conversion film 15b is an organic thin film, a high voltage of about 10 V may be applied to the accumulation control line 17. Therefore, since much more carriers are generated by photoelectric conversion, the charge accumulation region 44 and the lines connected to the charge accumulation region 44 are placed in a high-voltage state. Since the reset transistor 36 remains turned on, as the voltage in the charge accumulation region 44 becomes high, the source voltage Vsb of the reset transistor 36 is also raised. Similarly, a voltage rise also occurs in the reset drain node 46 connected to the source of the reset transistor 36 and in the lines directly connected to the reset drain node 46 are also raised.

To assure the reliability of the imaging device 101, therefore, the inventors used the reset transistor 36 that is turned off due to a clipping operation when the voltage of the charge accumulation region 44 becomes a predetermined clipping voltage Vcl or higher. The predetermined clipping voltage Vcl is lower than a voltage applied to the counter electrode 15a. The clipping voltage Vcl may be lower than the power supply voltage AVDD supplied to the amplification transistor 34.

Figure 7:
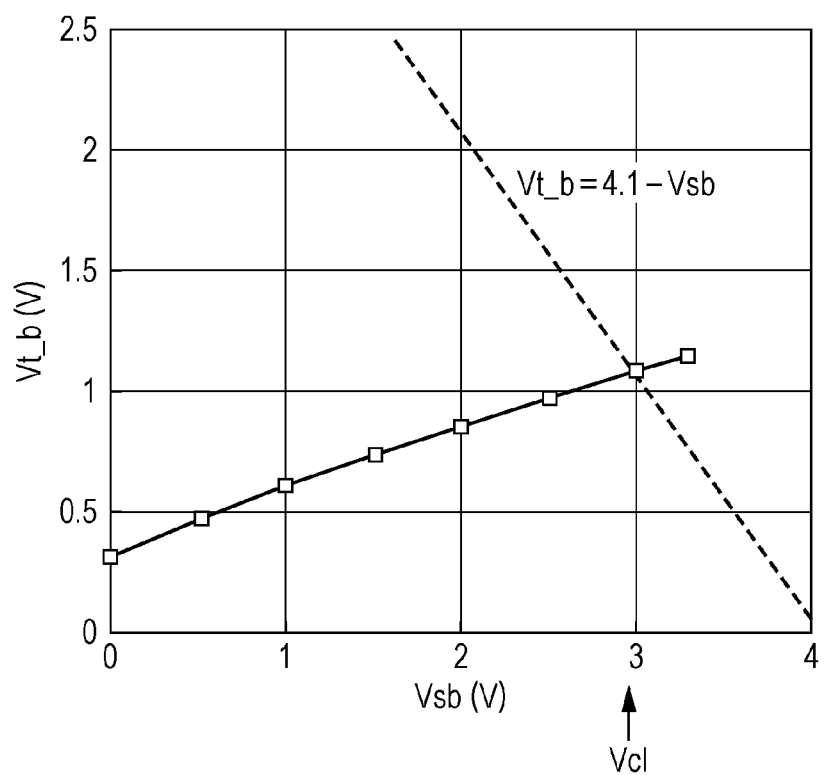
FIG. 7 illustrates the back bias effect of a reset transistor according to the first embodiment.

Specifically, the reset transistor 36 was designed so that when the second mode is entered by, for example, raising the potential of the reset signal line 26 to 4.1 V to turn on the reset transistor 36 and switch the sensitivity of the imaging device 101 to low sensitivity, the reset transistor 36 has a property as illustrated in FIG. 7. That is, as the reset transistor 36, the inventors used such a transistor that a point at which a Vsb-Vt_b curve equivalent to the back bias effect of the reset transistor 36 and a straight line represented by "Vt_b=4.1−Vsb" cross each other is at the clipping voltage Vcl. Here, Vt_b indicates a threshold voltage for the reset transistor 36. Thus, when the voltage of the reset drain node 46 becomes the clipping voltage Vcl, the reset transistor 36 is turned off. That is, the potential of the reset drain node 46 is clipped, preventing the potential from being raised to or above the clipping voltage Vcl. In this embodiment, the clipping voltage Vcl was set to about 3 V. The clipping voltage Vcl may be set to any voltage that is equal to or higher than a reference voltage in resetting and is lower than a voltage applied to the counter electrode 15a.

When a transistor the clipping voltage of which is Vcl is used as the reset transistor 36 as described above, a voltage rise to or above the clipping voltage Vcl is also prevented for devices in a second area 112 that includes, for example, the reset drain node 46 as well as the feedback transistor 38 and second capacitor 42, which are connected to the reset drain node 46. Therefore, resistance to a high voltage is no longer essential for the devices in the second area 112. In an example of high-voltage resistance, an insulating film such as an oxide film is thickened for elements connected to the reset drain node 46. Elements connected to the reset drain node 46 include, for example, the second capacitor 42 and feedback transistor 38. In another example of high-voltage resistance, an interval is widened between adjacent lines that are connected to the reset drain node 46 and to which different voltages are applied. Since high-voltage resistance is no longer essential for the devices in the second area 112, it is possible to achieve at least one of higher performance and a higher capacitance for the imaging device 101.

Specifically, as illustrated in FIG. 3, the effective thickness of the first gate insulating film 38g of the feedback transistor 38 can be made less than the effective thickness of the second gate insulating film 36g of the reset transistor 36. When the effective thickness of the first gate insulating film 38g of the feedback transistor 38 is less than the effective thickness of the second gate insulating film 36g of the reset transistor 36, this means that after conversion is made so that the first gate insulating film 38g of the feedback transistor 38 and the second gate insulating film 36g of the reset transistor 36 have the same dielectric rate, the thickness of the first gate insulating film 38g is less than the thickness of the second gate insulating film 36g. Thus, it is possible to achieve high performance for the feedback transistor 38. The effective thickness of the first gate insulating film 38g of the feedback transistor 38 may be at 80% or less of the effective thickness of the second gate insulating film 36g of the reset transistor 36 or may be 50% or less. The effective thickness of the first gate insulating film 38g of the feedback transistor 38 may be set to 30% or more of the effective thickness of the second gate insulating film 36g of the reset transistor 36. When the effective thickness of the first gate insulating film 38g of the feedback transistor 38 is set like this, the feedback transistor 38 can be stably operated.

If, for example, the first gate insulating film 38g and second gate insulating film 36g are made of the same material, the film thickness itself of the first gate insulating film 38g of the feedback transistor 38 may be smaller than the film thickness of the second gate insulating film 36g of the reset transistor 36 as illustrated in FIG. 3. However, the thickness itself of the first gate insulating film 38g does not necessarily becomes smaller than the thickness of the second gate insulating film 36g. The film thickness of the first gate insulating film 38g may become larger than the thickness of the second gate insulating film 36g, depending on the dielectric rate of the material of which the first gate insulating film 38g and second gate insulating film 36g are made.

The effective thickness of the dielectric layer 42g of the second capacitor 42 can be made smaller than the effective thickness of the second gate insulating film 36g of the reset transistor 36. Thus, it is possible to achieve a higher capacitance for the second capacitor 42. The effective thickness of the dielectric layer 42g of the second capacitor 42 may be 80% or less of the effective thickness of the second gate insulating film 36g of the reset transistor 36 or may be 50% or less. The effective thickness of the dielectric layer 42g of the second capacitor 42 may be set to equal to or less than the effective thickness of the first gate insulating film 38g of the feedback transistor 38. Thus, it is possible to achieve an even higher capacitance for the second capacitor 42. The effective thickness of the dielectric layer 42g of the second capacitor 42 may be set to 30% or more of the effective thickness of the second gate insulating film 36g of the reset transistor 36. When the effective thickness of the dielectric layer 42g of the second capacitor 42 is set like this, the reliability of the second capacitor 42 can be enhanced. When the second capacitor 42 has a higher capacitance, it is possible to achieve both a reduction in noise in the imaging device 101 and high saturation. Thus, it is possible for the imaging device 101 to have an even higher dynamic range.

It is also possible to narrow a wiring interval between lines connected to the reset drain node 46. As illustrated in, for example, FIG. 3, a first interval Sb is an interval between a line 361, which is connected to the source or drain of the reset transistor 36 and to which a first voltage is applied, and a line 362, which is adjacent to the line 361 and to which a second voltage different from the first voltage is applied. A second interval Sa is an interval between a line 363, which connects the pixel electrode 15c and charge accumulation region 44 together, and a line 364 adjacent to the line 363. Since the first interval Sb can be made narrower than the second interval Sa, it is possible to achieve a high density for the imaging device 101.

A specific description is given below by using FIG. 3. In FIG. 3, the line 361 is connected to one of source and drain of the reset transistor 36, which is connected to the feedback transistor 38. That is, the line 361 is connected to the reset drain node 46. The first voltage is applied to the line 361. The line 362 is adjacent to the line 361. The line 362 is connected to the gate of the feedback transistor 38. The line 362 is connected to the feedback control line 28. The second voltage different from the first voltage is applied to the line 362. The line 363 connects the pixel electrode 15c and upper electrode 41w together. In other words, the line 363 is connected to the pixel electrode 15c and one of source and drain of the reset transistor 36, which is not connected to the feedback transistor 38. That is, the line 363 connects the pixel electrode 15c and the charge accumulation region 44 together. The line 364 is adjacent to the line 363 and line 361. The line 364 is connected to the gate of the reset transistor 36. The line 364 is connected to the reset signal line 26.

In FIG. 3, the interval between the line 361 and the line 362 is denoted Sb, the interval between the line 361 and the line 364 is denoted Sb, and the interval between the line 364 and the line 363 is denoted Sa. In FIG. 3, Sa is larger than Sb. That is, the interval between the line 361, which is connected to the reset drain node 46, and the line 362 adjacent to the line 361 is set so as to be narrower than the interval between the line 363, which is not connected to the reset drain node 46, and the line 364 adjacent to the line 363. Thus, it is possible to achieve a high density for the imaging device 101. In FIG. 3, the interval between the line 361 and the line 362 and the interval between the line 361 and the line 364 may differ.

Method of Manufacturing the Imaging Device

Figure 8:
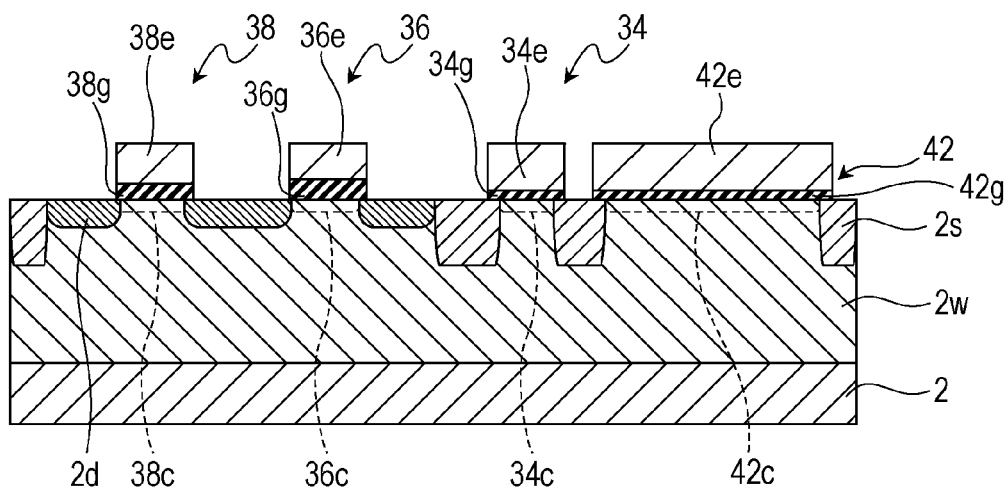
FIG. 8 is a schematic cross-sectional view illustrating the method of manufacturing the imaging device according to the first embodiment.
Figure 9:
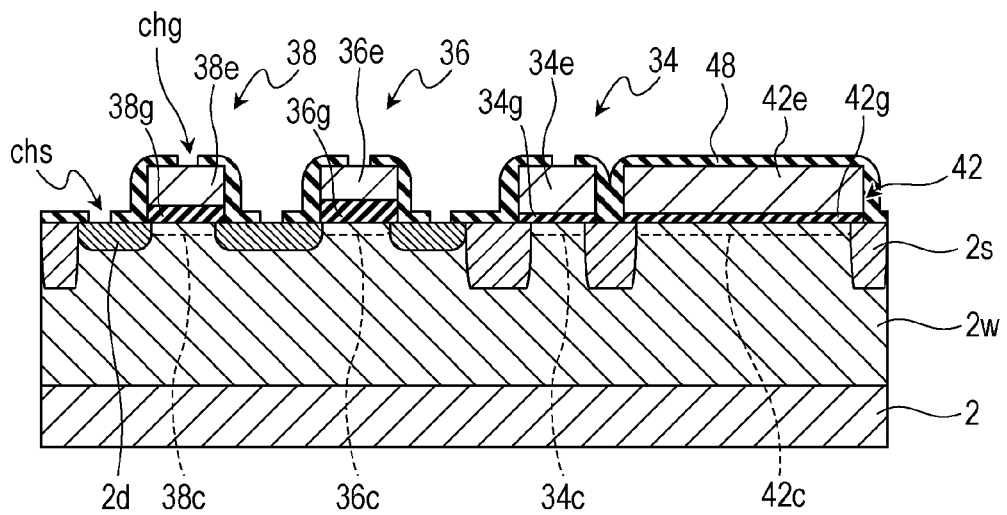
FIG. 9 is a schematic cross-sectional view illustrating the method of manufacturing the imaging device according to the first embodiment.
Figure 10:
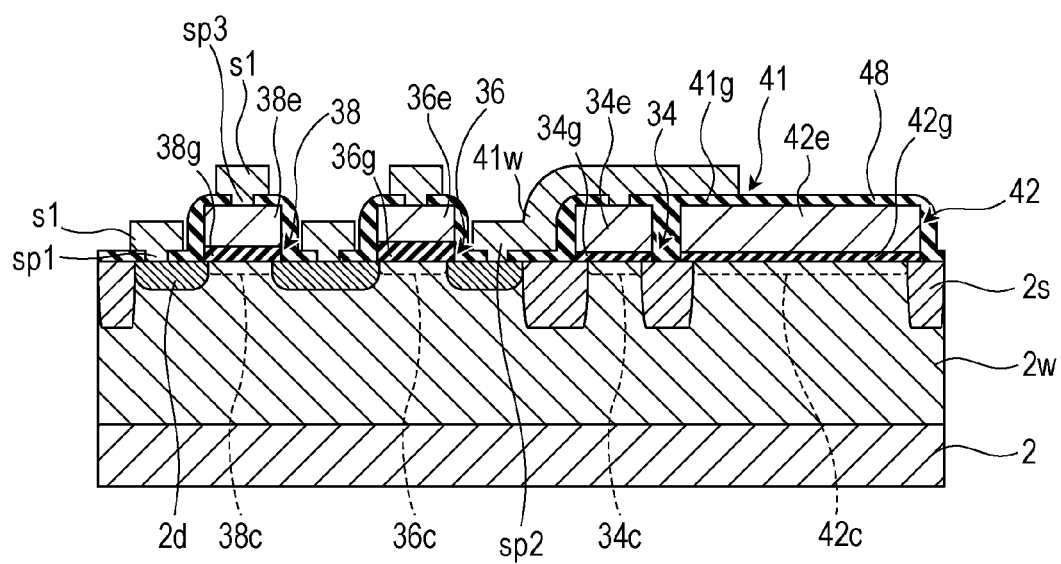
FIG. 10 is a schematic cross-sectional view illustrating the method of manufacturing the imaging device according to the first embodiment.

Next, an example of the method of manufacturing the imaging device 101 will be described with reference to FIGS. 8 to 10.

First, the semiconductor substrate 2 is prepared. In this example, a P-type silicon substrate is used. Then, a patterned resist mask is formed on the semiconductor substrate 2 by using lithography, after which the well 2w is formed by ion-implanting an acceptor (such as, for example, boron (B)) under a predetermined implantation condition.

Next, a resist mask (resist pattern) used to form channel regions for transistors to be placed on the pixel 11 is formed by using lithography. In this example, four transistors, amplification transistor 34, reset transistor 36, feedback transistor 38 and address transistor 40, are formed in the pixel 11. The resist mask is formed so as to cover portions other than those used as the channel regions of the transistors. After that, the channel regions of the transistors are formed by ion-implanting an acceptor or donor under a predetermined implantation condition. In FIG. 8, a channel region 34c for the amplification transistor 34, a channel region 36c for reset transistor 36, and a channel region 38c for the feedback transistor 38 are illustrated. By performing ion implantation, a desired property can be obtained for each transistor. For example, the clipping voltage of the reset transistor 36 can be set to Vcl.

In this example, a resist mask having an opening in a predetermined area on the semiconductor substrate 2 is used to ion-implant a donor (such as, for example, arsenic (As)) into the predetermined area on the semiconductor substrate 2. That is, in this example, the electrode region 42c is formed by performing ion-implantation in a predetermined area on the semiconductor substrate 2.

Next, gate oxidation is performed by in-situ steam generation (ISSG) to form a gate oxide film on the main surface of the semiconductor substrate 2. Typically, the gate oxide is silicon dioxide ($SiO_2$). Next, a material used to form a gate electrode is deposited on the gate oxide by chemical vapor deposition (CVD). In this example, a polysilicon film is formed on the gate oxide.

Next, a resist mask is formed on the polysilicon film by lithography. Then, dry etching is performed to form gate insulating films (third gate insulating film 34g, second gate insulating film 36g, and first gate insulating film 38g) from the gate oxide film and to form gate electrodes (third gate electrode 34e, second gate electrode 36e, and first gate electrode 38e) from the polysilicon film. At that time, patterning is executed so that a laminated body of the gate oxide film and polysilicon film is formed on an area as well on the semiconductor substrate 2 other than the areas in which the gate insulating films and gate electrodes of the four transistors. Thus, a structure in which the dielectric layer 42g and first electrode 42e are laminated in succession can be formed on part of the semiconductor substrate 2. That is, the second capacitor 42 used as a MIS capacitor can be formed concurrently with the formation of the gate insulating films and gate electrodes of the four transistors (see FIG. 8). Thus, in this embodiment, the second capacitor 42 can be formed in the pixel 11 without increasing the number of processes.

Next, a resist mask that covers portions to be used as the source regions and drain regions of the transistors is formed by lithography. After that, the element isolation regions 2s are formed by ion-implanting an acceptor under a predetermined implantation condition. The acceptor used to form the element isolation region 2s is not implanted directly into portions immediately below the gate electrodes of the transistors (third gate electrode 34e, second gate electrode 36e, and first gate electrode 38e) and the first electrode 42e of the second capacitor 42. In this example, the element isolation regions 2s are formed so as to enclose a combination of the reset transistor 36 and feedback transistor 38, a combination of the amplification transistor 34 and address transistor 40, and the second capacitor 42. After the element isolation regions 2s have been formed, the resist mask is removed.

Next, a resist mask having openings at the portions to be used as the source regions and drain regions of the transistors is formed by lithography. After that, the source/drain diffusion layers 2d are formed by ion-implanting a donor under a predetermined implantation condition (see FIG. 8). At that time, by applying so-called gate implantation, a donor may be ion-implanted into at least one of the first electrode 42e of the second capacitor 42 and the gate electrodes of the transistors in the pixel 11.

Next, an insulating film is formed by chemical-vapor deposition (CVD) so as to cover the polysilicon layers constituting the gate electrodes of the transistors and the first electrode 42e of the second capacitor 42 and the semiconductor substrate 2. Typically, the insulating film formed in this process is a silicon dioxide film.

Next, a resist mask used to form contact holes is formed by lithography on the insulating film that covers the polysilicon layers and semiconductor substrate 2. After that, dry etching is performed to form contact holes chg and contact holes chs on the gate electrodes of the transistors and the source/drain diffusion layers 2d, forming an insulating layer 48 (see FIG. 9). Another contact hole is also formed on the first electrode 42e of the second capacitor 42 to electrically connect the first electrode 42e to the reset drain node 46.

Next, a donor is ion-implanted through the contact holes chs and contact holes chg formed in the insulating layer 48 to form regions (not illustrated in FIG. 9) having a relatively high impurity concentration on the gate electrodes of the transistors and the source/drain diffusion layer 2d. Then, annealing is performed to activate the implanted impurity, reducing the resistances of the regions having a relatively high impurity concentration.

Next, a polysilicon film including an N-type impurity with a high concentration is deposited on the insulating layer 48 by CVD or another process. At that time, polysilicon is also deposited in the contact holes chs and chg formed in the insulating layer 48.

Next, a resist mask is formed by lithography. After the resist mask has been formed, drying etching is performed to form a polysilicon layer on the insulating layer 48 and to form polysilicon plugs sp1 and sp2 that connect the polysilicon layer on the insulating layer 48 and the source/drain diffusion layers 2d together and polysilicon plugs sp3 that connect the polysilicon layer on the insulating layer 48 and the gate electrodes (third gate electrode 34e, second gate electrode 36e, and first gate electrode 38e) of the transistors together. When a plug formed from polysilicon is used as a contact with the source/drain diffusion layer 2d, which is part of the charge accumulation region 44 (see FIG. 6, for example), an influence of a crystal defect attributable to a metal-semiconductor interface, which would otherwise be caused when a metal plug is used, can be avoided. This is advantageous in that dark current can be suppressed. After that, the front surface of the polysilicon layer on the insulating layer 48 are silicided to reduce resistance, forming polysilicon layers s1 used as conductive layers (see FIG. 10).

At that time, a conductive part (polysilicon line) connecting the source or drain of the reset transistor 36 and the third gate electrode 34e of the amplification transistor 34 together is formed by polysilicon patterning. Patterning is performed so that at least part of the conductive part overlaps the first electrode 42e of the second capacitor 42 with the insulating layer 48 intervening therebetween. Thus, the first capacitor 41 having a structure in which an insulating film is sandwiched between two polysilicon layers can be formed. As is clear from the above description, the upper electrode 41w of the first capacitor 41 can be part of the polysilicon layer s1, and the insulating film 41g of the first capacitor 41 can be part of the insulating layer 48. In the first embodiment, the first capacitor 41 can be formed in the pixel 11 without increasing the number of processes.

After the polysilicon layers s1 have been formed, inter-layer insulating layer 4s, the contact plug cpa for connecting between wiring layer 6s and upper electrode 41w, wiring layer 6s, inter-layer insulating layer 4a, via va, wiring layer 6a, inter-layer insulating layer 4b, via vb, wiring layer 6b, inter-layer insulating layer 4c, and via vc are formed in this order. Any number of inter-layer insulating layers and the like can be set. The number of inter-layer insulating layer does not need to be 4.

When the photoelectric converter 15 is formed on the inter-layer insulating layer 4c, the pixel 11 illustrated in FIG. 3 is obtained.

As described above, the imaging device 101 can be manufactured by using a known semiconductor technology. A camera system can be structured by using the imaging device 101 obtained as described above and an optical system that forms an image of a subject on the light receiving surface 15h of the photoelectric conversion film 15b. A protective film, a color filter, a lens (microlens), and the like may be further formed on the counter electrode 15a of the photoelectric converter 15.

Second Embodiment

The circuit in FIG. 2 has been used as an example of an applicable circuit in the first embodiment. In the second embodiment, a feedback operation may be performed for each pixel as illustrated in FIG. 11.

Figure 11:
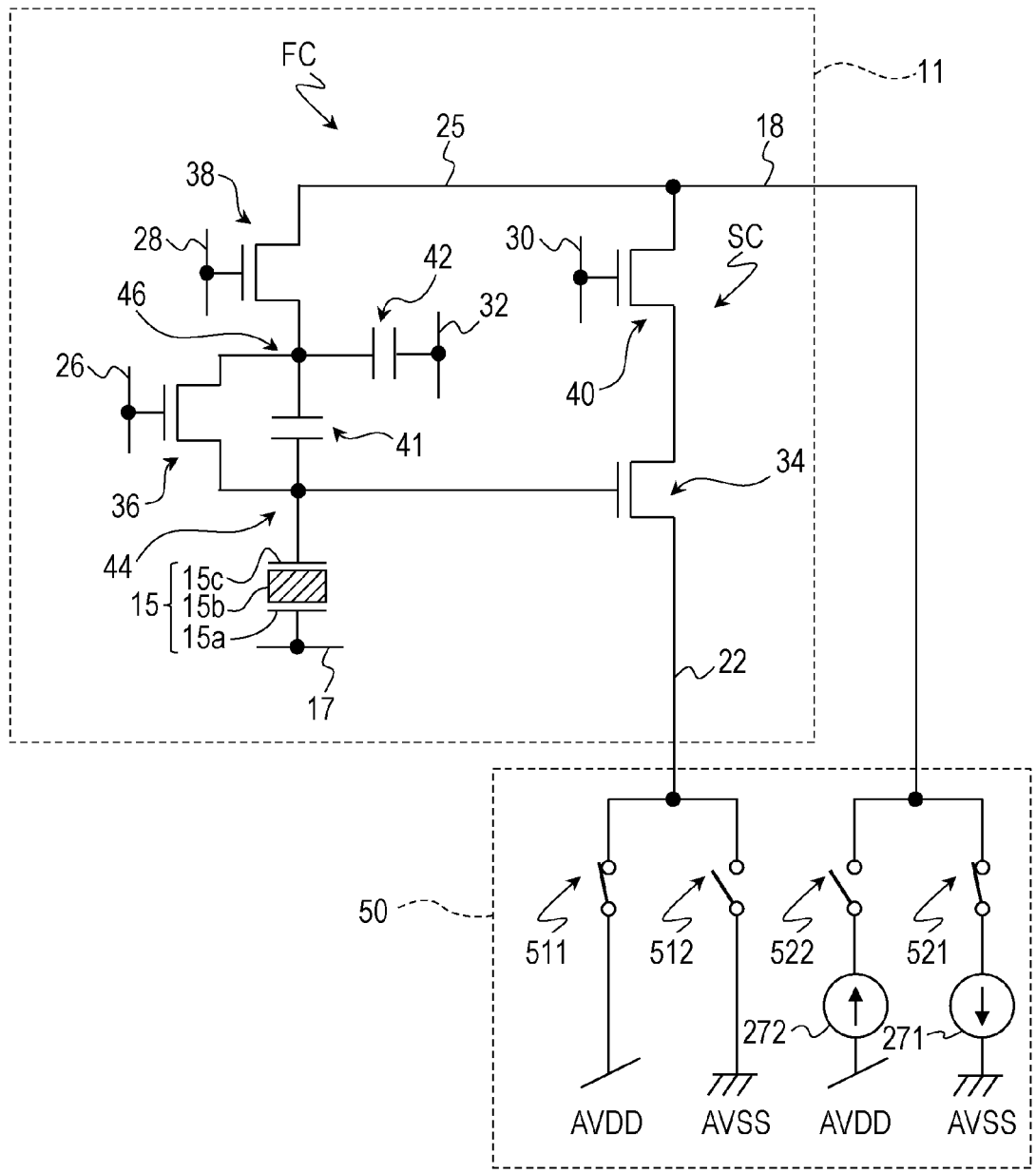
FIG. 11 illustrates a circuit structure illustrating an example of a pixel that uses intra-pixel feedback according to a second embodiment.

FIG. 11 schematically illustrates an exemplary circuit structure of the pixel 11 in an imaging device according to the second embodiment.

As illustrated in FIG. 11, the imaging device in the second embodiment differs from the imaging device 101 in the first embodiment in that a switching circuit 50 is provided for each column of pixels 11 instead of the inverting amplifier 24 (see FIG. 2). Therefore, the feedback line 25 does not mutually connect a plurality of pixels 11 constituting each column in the imaging device in the second embodiment.

In each pixel 11, the feedback line 25 is connected to one of source and drain of the feedback transistor 38, which is not connected to the reset drain node 46. The address transistor 40 is connected between the feedback line 25 and one of the source and drain of the amplification transistor 34. The source or drain, connected to the feedback line 25, of the address transistor 40 is connected to the vertical signal line 18. The description below will mainly focus on different points from the imaging device 101 in the first embodiment.

The switching circuit 50 includes switching elements 511 and 512 connected in parallel to a power supply line 22 and switching elements 522 and 521 connected in parallel to the vertical signal line 18. The switching element 511 is connected to a power supply voltage source (AVDD). The switching element 512 is connected to a reference potential source (AVSS). The switching element 522 is connected to a power supply voltage source (AVDD) through a constant-current source 272. The switching element 521 is connected to a reference potential source (AVSS) through a constant-current source 271.

In the pixel 11, when a signal is read out, one of the pixels 11 in each column is selected by applying a voltage to the gate of the address transistor 40 through the address signal line 30. When the switching element 511 and switching element 521 in the switching circuit 50 are turned on, a current flows from the constant-current source 271 in a direction, for example, from the amplification transistor 34 toward the address transistor 40, and the potential, amplified by the amplification transistor 34, of the charge accumulation region 44 is detected.

During a reset operation, when the switching element 512 and switching element 522 in the switching circuit 50 are turned on, a current flows into the address transistor 40 and amplification transistor 34 in the direction opposite to the direction when a signal is read out. Thus, a feedback circuit FC including the amplification transistor 34, address transistor 40, feedback line 25, feedback transistor 38, and reset transistor 36 is formed. At that time, the address transistor 40 and amplification transistor 34 have been cascoded, so a large gain can be obtained. Therefore, the feedback circuit FC can cancel noise with a large gain.

As with the imaging device 101 in the first embodiment, the imaging device in this embodiment can be operated in the first mode in which imaging is possible with relatively high sensitivity and the second mode in which imaging is possible with relatively low sensitivity by controlling the reset transistor 36 and feedback transistor 38. In addition, the imaging device in this embodiment can reduce kTC noise as in the first embodiment.

In the imaging device in this embodiment, the inverting amplifier 24 is not included and the address transistor 40 and amplification transistor 34 double as an amplifier in the signal detection circuit SC and an amplifier in feedback circuit FC. Therefore, the size of an area occupied to form the circuits in the imaging device can be reduced. It is also possible to reduce the power consumption of the imaging device. In addition, since a large gain can be obtained due to cascoding, even if the capacitances of the first capacitor 41 and second capacitor 42 are small, kTC noise can be reduced.

The layout of the elements in the pixel 11 illustrated in FIG. 11 can be almost the same as the layout of pixels 11 described in the first embodiment. The device structure of each element can also be almost the same as in the first embodiment. Therefore, the layout of the elements in the pixel 11 and its device structure will not be described. The method of manufacturing the pixel 11 in the second embodiment can be almost the same as the manufacturing method described with reference to FIGS. 7 to 10. Therefore, the method of manufacturing the pixel 11 in the second embodiment will be not be described.

Third Embodiment

In the embodiments described above, the second capacitor 42 has been formed as a so-called MIS capacitor by allocating the electrode region 42c on the semiconductor substrate 2. However, the structure of a capacitor with a high capacitance in the signal detection circuit SC is not limited to the examples described above. A capacitor having a structure in which a dielectric body is sandwiched between two electrodes formed from a metal or a metal compound may be placed in an inter-layer insulating layer provided between the semiconductor substrate 2 and photoelectric converter 15, as will be described later. In the description below, a structure in which a dielectric body is sandwiched between two electrodes formed from a metal or a metal compound will sometimes be referred to as the metal-insulator-metal (MIM) structure. When a capacitor placed in an inter-layer insulating layer between the semiconductor substrate 2 and the photoelectric converter 15 is formed as a capacitor having the so-called MIM structure, a larger capacitance value can be easily obtained. A device structure described below can be applied to the above embodiments.

Figure 12:
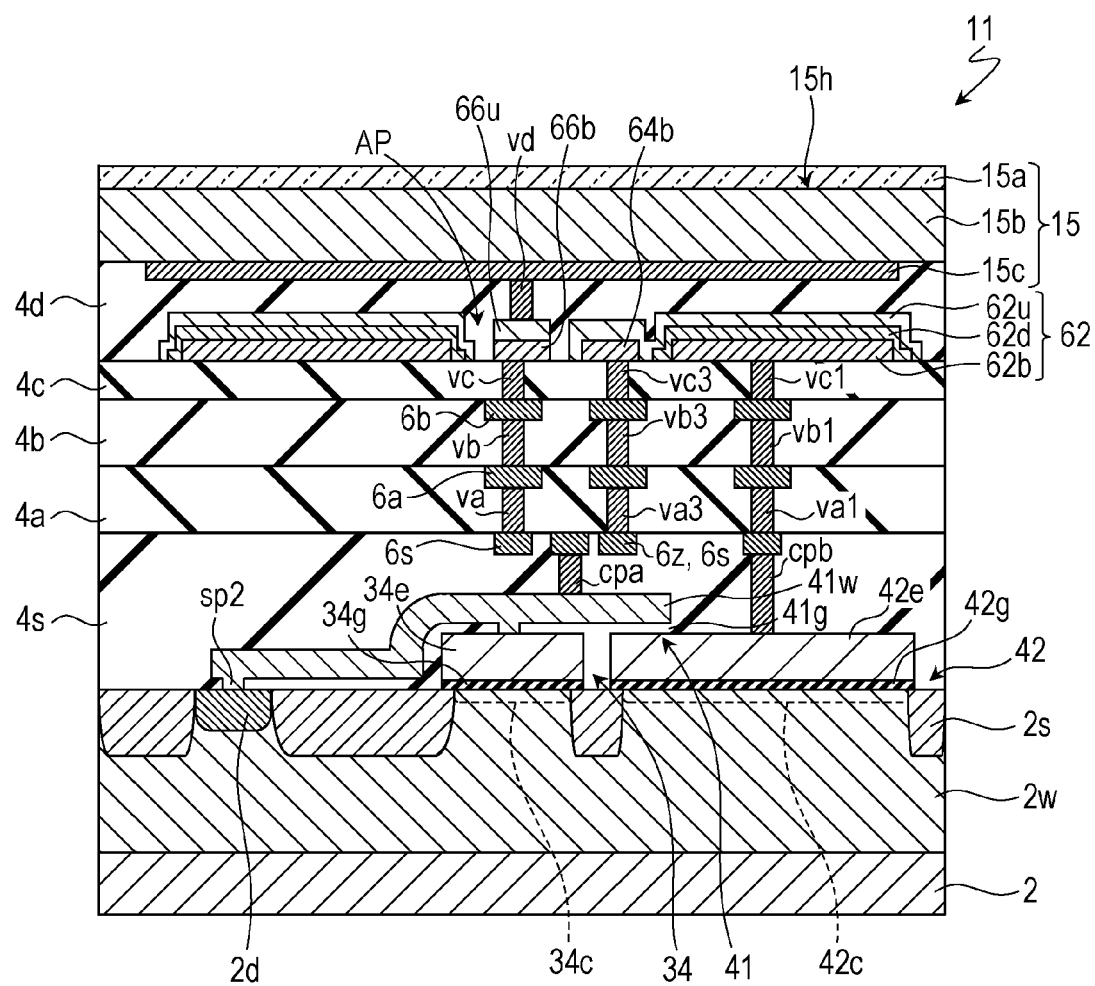
FIG. 12 is a cross-sectional view schematically illustrating another example of the device structure of the pixel that uses MIM.

FIG. 12 schematically illustrates another example of the device structure of the pixel 11.

The pixel 11 illustrated in FIG. 12 has a capacitor 62 placed between the semiconductor substrate 2 and the pixel electrode 15c. The capacitor 62 includes an upper electrode 62u, a bottom electrode 62b, and a second dielectric layer 62d placed between the upper electrode 62u and the bottom electrode 62b. As illustrated in the drawing, the bottom electrode 62b is disposed so as to be further away from the pixel electrode 15c than the upper electrode 62u is, that is, closer to the semiconductor substrate 2 than the upper electrode 62u is.

In this example, the bottom electrode 62b is formed on the inter-layer insulating layer 4c and the capacitor 62 is covered with an inter-layer insulating film 4d disposed between the inter-layer insulating layer 4c and the photoelectric conversion film 15b. When the bottom electrode 62b and upper electrode 62u are placed between the photoelectric converter 15 and the third gate electrode 34e of the amplification transistor 34 as described above, it is possible to suppress interference between the bottom electrode 62b and a wiring layer including the third gate electrode 34e of the amplification transistor 34 and between the upper electrode 62u and the wiring layer. This enables the capacitor 62 to have a relatively large electrode region.

Typically, the bottom electrode 62b is a metal oxide or metal nitride electrode. Examples of materials used to form the bottom electrode 62b include titanium (Ti), titanium nitride (TiN), tantalum (Ta), tantalum nitride (TaN), molybdenum (Mo), ruthenium (Ru), and platinum (Pt). The bottom electrode 62b may be part of a wiring layer provided in the inter-layer insulating film 4d.

The second dielectric layer 62d is laminated on the bottom electrode 62b. In this example, the second dielectric layer 62d covers the front surface, facing the pixel electrode 15c, of the bottom electrode 62b and its side surfaces.

The second dielectric layer 62d may be formed from a material, such as a metal oxide or metal nitride, different from the material (typically, silicon dioxide) from which the inter-layer insulating film 4d is formed. When the capacitor 62 is placed in the inter-layer insulating film provided between the semiconductor substrate 2 and the photoelectric converter 15, a material having a relatively high dielectric rate can be relatively easily used as a material from which the second dielectric layer 62d is formed. Therefore, a relatively large capacitance value can be easily achieved. Examples of materials used to form the second dielectric layer 62d include oxides and nitrides that include at least one selected from a group composed of zirconium (Zr), aluminum (Al), lanthanum (La), barium (Ba), tantalum (Ta), titanium (Ti), bismuth (Bi), strontium (Sr), silicon (Si), yttrium (Y), and hafnium (Hf). A material used to form the second dielectric layer 62d may be a binary compound, a ternary compound, or a quaternary compound. As a material used to form the second dielectric layer 62d, a material having a relatively high dielectric rate such as hafnium dioxide ($HfO_2$), aluminum oxide ($Al_2O_3$), zirconium dioxide ($ZrO_2$), titanium dioxide ($TiO_2$), and strontium titanate ($SrTiO_3$) can be used. The second dielectric layer 62d may include two or more layers formed from mutually different materials.

The upper electrode 62u is laminated on the second dielectric layer 62d. In this example, the upper electrode 62u covers the front surface, facing the pixel electrode 15c, of the second dielectric layer 62d and its side surfaces. Typically, the upper electrode 62u is a metal oxide or metal nitride electrode. That is, in this example, the capacitor 62 has a so-called MIM structure. As the material used to form the upper electrode 62u, the material from which the bottom electrode 62b is formed is used. The upper electrode 62u may be part of a wiring layer provided in the inter-layer insulating film 4d.

A protective layer formed from, for example, a metal such as copper (Cu) or aluminum (Al) or polysilicon may be placed between the upper electrode 62u and the second dielectric layer 62d. When a protective layer is placed between the upper electrode 62u and the second dielectric layer 62d, damage to the second dielectric layer 62d can be suppressed in the manufacturing process and the occurrence of a leak current can thereby be suppressed between the upper electrode 62u and the bottom electrode 62b.

The upper electrode 62u has an opening AP. A via vd, a connection part 66u, and a connection part 66b are placed in the opening AP. The connection part 66u and upper electrode 62u are in the same layer. The connection part 66b and bottom electrode 62b are in the same layer. As illustrated in FIG. 12, the pixel electrode 15c of the photoelectric converter 15 and the via vc having a connection to the third gate electrode 34e of the amplification transistor 34 are connected together through the via vd, connection part 66u, and connection part 66b. The via vd is formed from a metal such as copper. The via vd, connection part 66u, and connection part 66b constitute part of a charge accumulation region in a unit pixel cell 60A.

In the structure illustrated in FIG. 12, a portion, to the right of the via vd, of the bottom electrode 62b is connected to the first electrode 42e of the second capacitor 42 through a via vc1, the wiring layer 6b, a via vb1, the wiring layer 6a, a via va1, the wiring layer 6s, and a contact plug cpb provided in the inter-layer insulating layers 4s. That is, the bottom electrode 62b has a connection to the reset drain node 46 (not illustrated in FIG. 12). In this example, the bottom electrode 62b is a single electrode provided for each unit pixel cell 60A. Two portions of the bottom electrode 62b, which are separated to the right and left sides of the opening AP in FIG. 12, are at the same potential.

In this example, the upper electrode 62u covers a connection part 64b formed in the same layer as the bottom electrode 62b. The connection part 64b is connected to a line 6z, which is part of the wiring layer 6s, through a via vc3, the wiring layer 6b, a via vb3, the wiring layer 6a, and a via va3. The line 6z has a connection to the sensitivity adjustment line 32 (not illustrated in FIG. 12). That is, the capacitor 62 is connected electrically in parallel to the second capacitor 42 described above and functions similarly to the second capacitor 42. That is, in this example, the pixel 11 has a capacity circuit in which the first capacitor 41, capacitor 62, and second capacitor 42 are connected in series.

By forming the capacitor 62 in the pixel 11, the second capacitor 42 can be omitted. When the second capacitor 42 is omitted, there is no need to reserve an area for the electrode region 42c on the semiconductor substrate 2. This increases flexibility in the design of an element layout on the semiconductor substrate 2. For example, since the electrode region 42c is omitted, the pixel size can be reduced. Alternatively, the size of a transistor (amplification transistor 34, for example) on the semiconductor substrate 2 can be increased. When a transistor size is increased, variations in the property of the transistor can be reduced, so variations in sensitivity among unit pixel cells 60A can be reduced. Another advantage of the increased transistor size is that a driving capacity, that is, mutual conductance gm, is increased and noise can thereby be more reduced.

In this example, the upper electrode 62u is electrically connected to the via vc3, on the surface opposite to the surface facing the pixel electrode 15c of the photoelectric converter 15. Since a contact for an electrical connection between the upper electrode 62u and the sensitivity adjustment line 32 is provided on a surface close to the semiconductor substrate 2 as described above, complex wiring can be avoided. In addition, since the distance between the upper electrode 62u and the pixel electrode 15c of the photoelectric converter 15 can be shortened, a stray capacitance between charge accumulation regions in mutually adjacent pixels 11 can be reduced.

When the imaging device 101 is operated, a predetermined voltage is applied to the upper electrode 62u through the sensitivity adjustment line 32. In this example, the upper electrode 62u is a single electrode provided for each unit pixel cell 60A (see FIG. 13, which will be referenced in the description below), as with the bottom electrode 62b. Therefore, the two portions of the upper electrode 62u, which are separated to the right and left sides of the opening AP in FIG. 12, are at the same potential.

Figure 13:
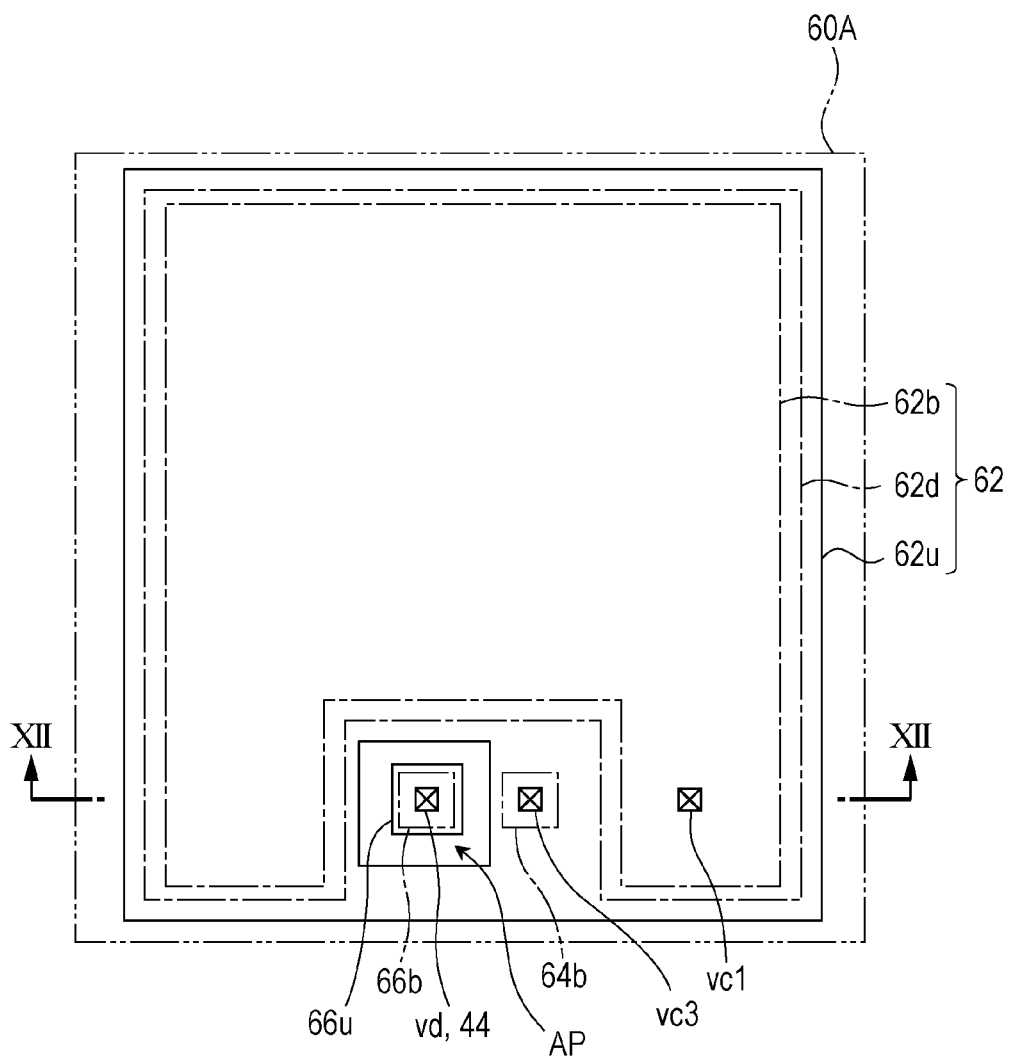
FIG. 13 is a schematic plan view illustrating an example of the placement of the upper electrode, dielectric layer, and bottom electrode of the pixel in FIG. 12.

FIG. 13 illustrates an example of the placement of the upper electrode 62u, second dielectric layer 62d, and bottom electrode 62b when the pixel 11 is viewed from the direction of the normal of the semiconductor substrate 2. As illustrated in FIG. 13, when viewed from the direction of the normal of the semiconductor substrate 2, the shapes of the upper electrode 62u and bottom electrode 62b do not need to match. It is only necessary that the upper electrode 62u includes a portion that faces at least part of the bottom electrode 62b when viewed from the direction of the normal of the semiconductor substrate 2.

In this example, the upper electrode 62u and bottom electrode 62b each occupy a large area in the pixel 11. Therefore, when at least one of the upper electrode 62u and bottom electrode 62b is formed as a light-shielding electrode, the upper electrode 62u or bottom electrode 62b can be made to function as a light-shielding layer. When the upper electrode 62u, for example, is made to function as a light-shielding layer, it is possible to have the upper electrode 62u shield light that has passed through a space between pixel electrodes 15c. Thus, it is possible to inhibit light having passed through a space between pixel electrodes 15c from entering the channel region of a transistor (amplification transistor 34, for example) on the semiconductor substrate 2. When, for example, a TaN electrode with a thickness of 100 nm is formed as the upper electrode 62u, light can be adequately shielded.

In this embodiment, it is possible to inhibit a shift of a transistor property such as, for example, variations in a threshold voltage by inhibiting stray light from entering the channel region of a transistor on the semiconductor substrate 2. When the entrance of stray light into the channel region of a transistor on the semiconductor substrate 2 is inhibited, the property of transistors in each pixel 11 is stabilized, making it possible to reduce variations in the operations of transistors among a plurality of pixels 11. Thus, when the entrance of stray light into the channel region of a transistor on the semiconductor substrate 2 is inhibited, this contributes to improving the reliability of the imaging device 101.

Fourth Embodiment

A camera system 105 having the imaging device 101 in this embodiment will be described with reference to FIG. 14.

Figure 14:
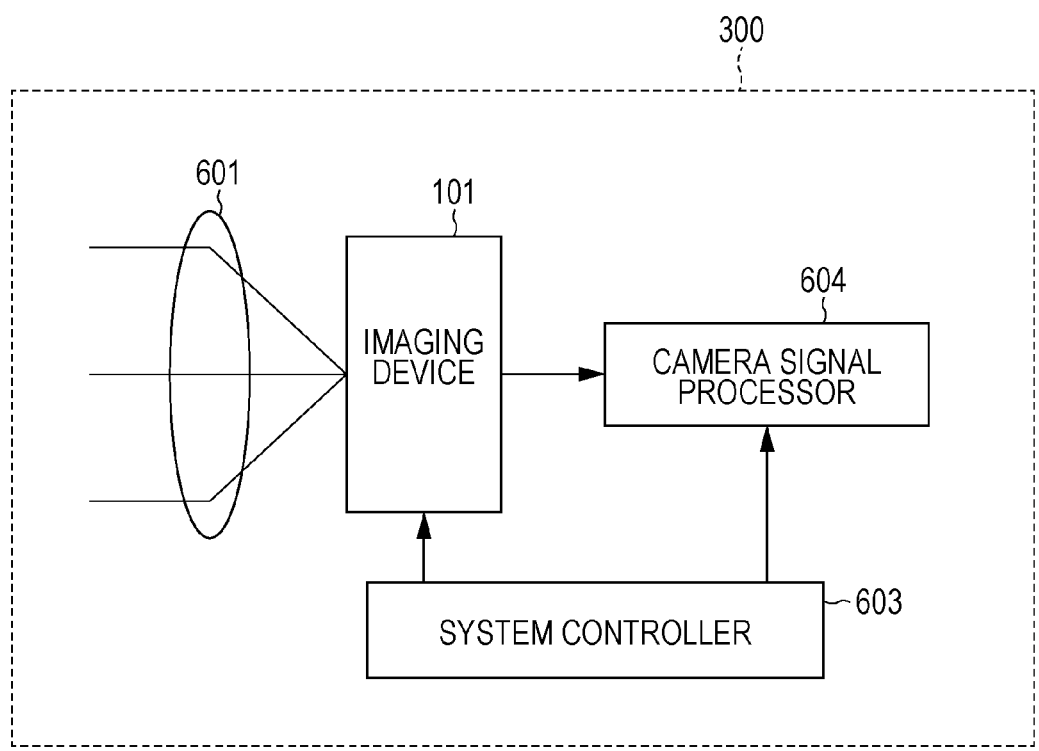
FIG. 14 schematically illustrates an example of the structure of a camera system that includes the imaging device according to a fourth embodiment.

FIG. 14 schematically illustrates an example of the structure of the camera system 105 according to this embodiment. The camera system 105 has a lens optical system 601, the imaging device 101, a system controller 603, and a camera signal processor 604.

The lens optical system 601 includes, for example, an autofocus lens, a zooming lens, and a diaphragm. The lens optical system 601 focuses light onto the imaging surface of the imaging device 101.

As the imaging device 101, the imaging device 101 in the embodiments described above is used. The system controller 603 controls the whole of the camera system 105. The system controller 603 is implemented by, for example, a microcomputer.

The camera signal processor 604 functions as a signal processing circuit that processes an output signal from the imaging device 101. The camera signal processor 604 performs gamma correction, color interpolation processing, color interpolation processing, space interpolation processing, white balancing, and other processing, for example. The camera signal processor 604 is implemented by, for example, a digital signal processor (DSP).

The camera system 105 in this embodiment can appropriately suppress reset noise (kTC noise) at the time of read-out by using the imaging device 101 in the above embodiments and can accurately read out charges, enabling a superior image to be captured.

In addition, it is possible to implement a camera system that can make a switchover between the first mode, in which imaging is possible with relatively high sensitivity, and the second mode, in which imaging is possible with relatively low sensitivity, before taking a picture. Furthermore, even if high-intensity light like sunlight enters the imaging device 101 in the second mode, the imaging device 101 can be effectively protected with ease. Therefore, it is possible to implement a wide dynamic range and to reduce noise.

The present disclosure is not limited to the embodiments described above. For example, another embodiment implemented by combining arbitrary constituent elements described in this specification or excluding some constituent elements may be included in the present disclosure. In addition, variations obtained by applying various modifications that a person having ordinary skill in the art thinks of to the embodiments described above are also included in the present disclosure, without departing from the intended scope of the present disclosure, that is, the meanings indicated by the text in the claims of the present disclosure.

The embodiments of the present disclosure are useful for a digital camera and the like.

What is claimed is:
1. An imaging device comprising:
a pixel including
a photoelectric converter including a first electrode, a second electrode facing the first electrode, and a photoelectric conversion film between the first electrode and the second electrode, the photoelectric conversion film converting light into a charge,
a first transistor having a first source, a first drain and a first gate, the first gate being connected to the first electrode, and
a second transistor having a second source and a second drain, one of the second source and the second drain being connected to the first electrode and being a charge accumulation region that accumulates the charge; and
a first voltage supply circuit configured to supply a first voltage to the second electrode, wherein
the charge accumulation region accumulates the charge when the second transistor is in an on state,
the second transistor is configured to be turned off by a clipping operation when the charge accumulated in the charge accumulation region causes a voltage of the charge accumulation region to become equal to or greater than a clipping voltage, and
the clipping voltage is lower than the first voltage.
2. The imaging device according to claim 1, further comprising a second voltage supply circuit that supplies a second voltage to one of the first source and the first drain of the first transistor, wherein
the clipping voltage is lower than the second voltage.
3. The imaging device according to claim 1, wherein
the second transistor has a first gate insulting film and a second gate on the first gate insulting film,
the pixel includes a third transistor having a third source, a third drain, a second gate insulating film and a third gate on the second gate insulating film, one of the third source and the third drain being connected to the other of the second source and the second drain of the second transistor, and
an effective thickness of the second gate insulting film is less than an effective thickness of the first gate insulting film.
4. The imaging device according to claim 3, wherein the effective thickness of the second gate insulating film is 80% or less of the effective thickness of the first gate insulating film.

5. The imaging device according to claim 4, wherein the effective thickness of the second gate insulating film is 50% or less of the effective thickness of the first gate insulating film.
6. The imaging device according to claim 5, wherein the effective thickness of the second gate insulating film is 30% or greater of the effective thickness of the first gate insulating film.
7. The imaging device according to claim 1, wherein
the second transistor has a first gate insulting film and a second gate on the first gate insulting film,
the pixel has a first capacitor connected to the other of the second source and the second drain of the second transistor,
the first capacitor has a third electrode, a fourth electrode facing the third electrode, and a dielectric layer between the third electrode and the fourth electrode, and
an effective thickness of the dielectric layer is less than an effective thickness of the first gate insulting film.
8. The imaging device according to claim 7, wherein
the pixel includes a third transistor having a third source, a third drain, a second gate insulting film and a third gate being on the second gate insulting film, of the third source and the third drain being connected to the other of the second source and the second drain of the second transistor, and
the effective thickness of the dielectric layer is less than an effective thickness of the second gate insulting film.
9. The imaging device according to claim 1, wherein the clipping voltage is greater than 0V.
10. The imaging device according to claim 1, wherein the clipping voltage is equal to or greater than a reference voltage in resetting.
11. The imaging device according to claim 1, wherein
the second transistor has a first gate insulting film and a second gate on the first gate insulting film,
the pixel has a first capacitor connected to the other of the second source and the second drain of the second transistor,
the first capacitor has a third electrode, a fourth electrode facing the third electrode, and a dielectric layer between the third electrode and the fourth electrode, and
a dielectric constant of the dielectric layer is greater than a dielectric constant of the first gate insulting film.
12. A camera system comprising:
the imagining device according to claim 1;
a lens optical system that focuses light onto the imaging device; and
a camera signal processor that processes a signal output from the imaging device.
13. An imaging device comprising:
a pixel including
a photoelectric converter including a first electrode, a second electrode facing the first electrode, and a photoelectric conversion film between the first electrode and the second electrode, the photoelectric conversion film converting light into a charge,
a first transistor having a first source, a first drain and a first gate, the first gate being connected to the first electrode, and
a second transistor having a second source and a second drain, one of the second source and the second drain being connected to the first electrode and being a charge accumulation region that accumulates the charge; and a first voltage supply circuit configured to supply a first voltage to the second electrode, wherein the second transistor is configured to be turned off by a clipping operation when an accumulation of the charge causes a voltage of the charge accumulation region to become equal to or greater than a clipping voltage, the clipping voltage is lower than the first voltage, the pixel further includes a first line connected to the other of the second source and the second drain of the second transistor, a second voltage being applied to the first line, a second line adjacent to the first line, a third voltage different from the second voltage being applied to the second line, a third line connecting the first electrode and the first gate together, and a fourth line adjacent to the third line, and an interval between the first line and the second line is less than an interval between the third line and the fourth line.

* * * * *